United States Patent [19]
Galbi et al.

[11] Patent Number: 5,870,497
[45] Date of Patent: Feb. 9, 1999

[54] DECODER FOR COMPRESSED VIDEO SIGNALS

[75] Inventors: David E. Galbi, San Jose; Stephen C. Purcell, Mountain View; Eric Chi-Wang Chai, Sunnyvale, all of Calif.

[73] Assignee: C-Cube Microsystems, Milpitas, Calif.

[21] Appl. No.: 891,507

[22] Filed: May 28, 1992

Related U.S. Application Data

[63] Continuation-in-part of Ser. No. 669,818, Mar. 15, 1991, abandoned.

[51] Int. Cl.$^6$ .................................................. G06K 9/36
[52] U.S. Cl. ................................................ 382/232
[58] Field of Search .................................. 382/232, 236, 382/248, 250; 348/400, 403; 358/432, 433

[56] References Cited

U.S. PATENT DOCUMENTS

| | | | |
|---|---|---|---|
| 4,254,399 | 3/1981 | Burkhardt et al. | 382/43 |
| 4,604,500 | 8/1986 | Brown et al. | 179/18 |
| 4,774,574 | 9/1988 | Daly et al. | 358/133 |
| 5,117,287 | 5/1992 | Koike et al. | 382/50 |
| 5,122,873 | 6/1992 | Golin | 382/49 |
| 5,181,183 | 1/1993 | Miyazaki | 364/725 |
| 5,212,742 | 5/1993 | Normile et al. | 382/56 |

FOREIGN PATENT DOCUMENTS

| | | | |
|---|---|---|---|
| 0248729 A1 | 12/1987 | European Pat. Off. | G06F 15/332 |
| 0286184 A1 | 10/1988 | European Pat. Off. | G06F 15/347 |
| 447 203 A2 | 9/1991 | European Pat. Off. | H04N 7/133 |
| 0474246 A3 | 3/1992 | European Pat. Off. | G06F 15/332 |
| 59-035267 | 2/1984 | Japan | G06F 15/16 |
| 60-074074 | 4/1985 | Japan | G06C 15/00 |
| 3-211604 | 9/1991 | Japan | G06C 15/00 |

OTHER PUBLICATIONS

Proceedings of the IEEE 1991 Custom Integrated Circuits Conference, May 1991, San Diego, CA, pp. 12.2.1–12.2.4, XP000295731, Bolton et al., "A Complete Single–Chip Implementation of the JPEG Image Compression Standard".

Microprocessing and Microprogramming, vol. 30, No. 1/5, Aug. 1990, Amsterdam, pp. 439–445, XP000141680, De Sa et al., "A Parallel Architecture for Real–Time Video Coding".

Thirty–Sixth IEEE Computer Society International Conference/Digest of Papers, 1991, San Francisco, CA, pp. 318–323, XP000294004, Purcell, "The C–Cube CL550 JPEG Image Compression Processor".

Proceedings of the International Symposium on Mini and Micro Computers, Nov. 1977, Montreal, Que, CA, pp. 141–146, Troxel et al., "A Multichannel Real–time Buffer Controller".

Electronics and Communications in Japan, vol. 69, No. 2, 1986, New York, US pp. 76–83, Sumita, "Analysis of Common Memory Access Contention with Nonpreemptive Priority Discipline".

*Primary Examiner*—Jose L. Couso
*Attorney, Agent, or Firm*—Skjerven, Morrill, MacPherson, Franklin, & Friel; Edward C. Kwok

[57] ABSTRACT

A decoder for compressed video signals comprises a central processing unit (CPU), a dynamic random access memory (DRAM) controller, a variable length code (VLC) decoder, a pixel filter and a video output unit. The microcoded CPU performs dequantization and inverse cosine transform using a pipelined data path, which includes both general purpose and special purpose hardware. In one embodiment, the VLC decoder is implemented as a table-driven state machine where the table contains both control information and decoded values.

22 Claims, 19 Drawing Sheets

Figure 3a-1

| | | | REG FILE FETCH | | | BUTTERFLY | MULTIPLY | | | | REG FILE WRITE | | |
|---|---|---|---|---|---|---|---|---|---|---|---|---|---|
| | ZMEM | TMEM | PMEM | A + | B + | C | E | E1 | E2 | E3 | R1 + | R2 | R3 |
| 1 | X3 | X1p | | | | | | | | | | | |
| 2 | X5 | X7p | | A0 | B0 | · | Bp | X0 | X4 | A1 | B0p | B1p | A1 |
| 3 | X1 | X2p | | · | · | · | AA | X3 | X0 | X4 | AB0 | AA1 | dX4 |
| 4 | | X6p | | cX2 | cX6 | dX4 | Ap | X5 | X3 | X0 | A0p | A1p | dX0 |
| 5 | X7 | X0p | | · | · | · | C | dX4 | X5 | X3 | C0 | C1 | dX3 |
| 6 | | X4p | | iA1 | iB1 | C1 | Cp | X1 | dX4 | X5 | C0p | C1p | dX5 |
| 7 | X2 | | | cX0 | c0 | · | BB | C1 | X1 | dX4 | BB0 | BB1 | · |
| 8 | | X3p | | · | · | AA1 | D | X7 | C1 | X1 | DD | D1 | dX1 |
| 9 | | X5p | | D1 | BB0 | dX0 | Dp | AA1 | X7 | C1 | D0p | D1p | · |
| 10 | | | | C0 | D0 | BB1 | CC | dX0 | AA1 | X7 | CC0 | CC1 | dX7 |
| 11 | | AAA0 | | CC1 | AA0 | B1p | DD | BB1 | dX0 | AA1 | DD0 | CC1 | · |
| 12 | | AAA1 | | A0p | B0p | A1p | AAA | B1p | BB1 | dX0 | DD0 | · | CX00 |
| 13 | X6 | BBB0 | | DD1 | A0p | C1p | AAp | A1p | B1p | BB1p | AA0p | AA1p | · |
| 14 | X4 | BBB1 | | D0p | C0p | · | BBB | C1p | A1p | B1p | · | · | B1p |
| 15 | | DDD0 | | DC0 | AA0 | · | DDp | X2 | C1p | A1p | DD0p | DD1p | A1p |
| 16 | | DDD0 | | iA1p | iB1p | dX3 | DDD | X6 | X2 | C1p | · | · | C1p |
| 17 | | DDD1 | | CC0 | BB0 | dX5 | BBp | dX3 | X6 | X2 | BB0p | BB1p | dX2 |
| 18 | | CCC0 | | D1p | iC1p | dX1 | CCC | dX5 | dX3 | X6 | · | · | dX6 |
| | | | | DD0p | AA0p | dX7 | CCp | dX1 | dX5 | dX3 | · | · | dX3 |

| | CCC1 | | cX3 CC0p CX1 CC1p cX00 DD1p · | cX5 BB0p AA0p R0 B0 A0 | AA1p DX2 BB1p dX6 B1 A1 · | DD0p B CCCp A AAAp cX00 BBBp · | dX7 AA1p dX2 BB1p dX6 B1 A1 X4 | dX1 DX7 AA1p dX2 BB1p dX6 B1 A1 | dX5 DX1 DX7 AA1p dX2 BB1p dX6 B1 | CC0p · B0 · A0 · CX0 · | CC1p · B1 · A1 · · · | cX3 · cX1 · · cX2 · dX6 B1 |
|---|---|---|---|---|---|---|---|---|---|---|---|---|
| 19 | | | | | | | | | | | | |
| 20 | | | DDD0p | | | | | | | | | |
| 21 | | | DDD1p | | | | | | | | | |
| 22 | | | CCC0p | | | | | | | | | |
| 23 | | | CCC1p | | | | | | | | | |
| 24 | | | AAA0p | | | | | | | | | |
| 25 | | X0 | AAA1p | | | | | | | | | |
| 26 | | | BBB0p BBB1p | | | | | | | | | |

KEY TO FIGURE 3a

| FIGURE 3a-1 | FIGURE 3a-2 |
|---|---|

Figure 3a-2

| # regs in use | | R2 | R3 | R4 | R5 | R6 | R7 | R8 | R9 | R10 | R11 |
|---|---|---|---|---|---|---|---|---|---|---|---|
| 8 | 0 | A0 | iA1 | B0 | iB1 | cX2 | cX6 | cX0 | dX4 | | |
| 8 | 1 | A0 | iA1 | B0 | iB1 | cX2 | cX6 | cX0 | dX4 | | |
| 8 | 2 | | iA1 | | iB1 | cX2 | cX6 | cX0 | dX4 | | |
| 10 | 3 | | iA1 | | iB1 | cX2 | cX6 | cX0 | dX4 | | |
| 10 | 4 | | iA1 | | iB1 | | | cX0 | | | |
| 13 | 5 | dX3 | iA1 | | iB1 | C0 | C1 | cX0 | | A0p | A1p |
| 13 | 6 | dX3 | dX5 | | | C0 | | cX0 | | A0p | A1p |
| 14 | 7 | dX3 | dX5 | BB0 | BB1 | C0 | | | | A0p | A1p |
| 16 | 8 | dX3 | dX5 | BB0 | BB1 | C0 | | D0 | D1 | A0p | A1p |
| 16 | 9 | dX3 | dX5 | BB0 | BB1 | C0 | | D0 | | A0p | A1p |
| 16 | 10 | dX3 | dX5 | BB0 | dX7 | CC0 | CC1 | | | A0p | A1p |
| 16 | 11 | dX3 | dX5 | BB0 | dX7 | CC0 | | DD0 | DD1 | A0p | A1p |
| 15 | 12 | dX3 | dX5 | BB0 | dX7 | CC0 | | DD0 | DD1 | A0p | |
| 14 | 13 | dX3 | dX5 | BB0 | dX7 | CC0 | | DD0 | | AA0p | AA1p |
| 13 | 14 | dX3 | dX5 | BB0 | dX7 | CC0 | | DD0 | | AA0p | AA1p |
| 14 | 15 | dX3 | dX5 | BB0 | dX7 | CC0 | | | | AA0p | AA1p |
| 12 | 16 | | dX5 | BB0 | dX7 | CC0 | | | | AA0p | AA1p |
| 12 | 17 | | | | dX7 | dX2 | dX6 | BB0p | BB1p | AA0p | AA1p |
| 10 | 18 | | | | dX7 | dX2 | dX6 | BB0p | BB1p | AA0p | AA1p |
| 11 | 19 | cX3 | | | | dX2 | dX6 | BB0p | BB1p | AA0p | AA1p |
| 9 | 20 | | | | | dX2 | dX6 | BB0p | BB1p | AA0p | |
| 9 | 21 | | | B0 | B1 | | dX6 | | BB1p | AA0p | |
| 8 | 22 | | | B0 | B1 | | dX6 | | | AA0p | |
| 5 | 23 | A0 | A1 | B0 | B1 | | | | | | |
| 4 | 24 | A0 | A1 | B0 | | cX2 | | | | | |
| 4 | 25 | A0 | | | B0 | | cX2 | | cX0 | | |
| 6 | 26 | A0 | | | B0 | | cX2 | cX6 | cX0 | | |
| 6 | | | A0 | | B0 | iB1 | cX2 | cX6 | cX0 | | |
| 5 | | | | | iA1 | iB1 | cX2 | cX6 | cX0 | | |
| 6 | | | | | iA1 | iB1 | cX2 | cX6 | cX0 | dX4 | |

FIGURE 3b-1

| R12 | R13 | R14 | R15 | R16 | R17 | R18 | R19 | |
|---|---|---|---|---|---|---|---|---|
| | | | | | | | | 0 |
| | | | | | | | | 1 |
| B0p | B1p | | | | | | | 2 |
| B0p | B1p | | | | | AA0 | AA1 | 3 |
| B0p | B1p | | | | dX0 | AA0 | AA1 | 4 |
| B0p | B1p | | | | dX0 | AA0 | AA1 | 5 |
| B0p | B1p | C0p | C1p | | dX0 | AA0 | AA1 | 6 |
| B0p | B1p | C0p | C1p | | dX0 | AA0 | AA1 | 7 |
| B0p | B1p | C0p | C1p | | dX0 | AA0 | dX1 | 8 |
| B0p | B1p | C0p | C1p | D0p | D1p | AA0 | dX1 | 9 |
| B0p | B1p | C0p | C1p | D0p | D1p | AA0 | dX1 | 10 |
| B0p | | C0p | C1p | D0p | D1p | AA0 | dX1 | 11 |
| | CX00 | C0p | C1p | D0p | D1p | AA0 | dX1 | 12 |
| | CX00 | C0p | | D0p | D1p | AA0 | dX1 | 13 |
| | CX00 | | | iB1p | D1p | AA0 | dX1 | 14 |
| | CX00 | DD0p | DD1p | iB1p | D1p | iA1p | dX1 | 15 |
| | CX00 | DD0p | DD1p | iC1p | D1p | | dX1 | 16 |
| | CX00 | DD0p | DD1p | iC1p | D1p | | dX1 | 17 |
| | CX00 | DD0p | DD1p | | | | | 18 |
| | CX00 | | DD1p | CC0p | CC1p | | | 19 |
| | CX00 | | DD1p | CC0p | CC1p | | | 20 |
| | CX00 | | DD1p | | CC1p | | cX1 | 21 |
| | CX00 | | DD1p | | CC1p | | | 22 |
| | CX00 | | DD1p | | | | | 23 |
| | CX00 | | DD1p | | | | | 24 |
| | | | DD1p | | | | | 25 |
| | | | | | | | | 26 |

FIGURE 3b-2

KEY TO FIGURE 3b

| FIGURE 3b-1 | FIGURE 3b-2 |
|---|---|

KEY TO FIGURE 7

| FIGURE 7-1 |
|---|
| FIGURE 7-2 |

FIGURE 7-1

```
ucode () ( reg (loopcnt, r1)

/* Registers used for dequantization and cosine multiply */
reg(dX0,r17)      reg(dX1, r19)     reg(dX2 ,r6)      reg(dX3, r2)
reg(dX4,r9)       reg(dX5, r3)      reg(dX6 ,r7)      reg(dX7, r5)
reg(cX0,r8)       reg(cX00, r13)    reg(cX1 ,r19)     reg(cX2, r6)
reg(cX3,r2)       reg(cX6, r7)

/* Registers used for 1st pass of IDCT (ZMEM to TMEM) */
reg(A, r2)        reg(A1, r3)       reg(iA1, r3)
reg(B, r4)        reg(B1, r5)       reg(iB1, r5)
reg(C, r6)        reg(C1, r7)
reg(D, r8)        reg(D1, r9)
reg(AA, r18)      reg(AA1, r19)
reg(BB, r4)       reg(BB1, r5)
reg(CC, r6)       reg(CC1, r7)
reg(DD, r8)       reg(DD1, r9)

* Registers used for 2nd pass of IDCT (TMEM to PMEM) */
reg(Ap, r10)      reg(A0, r10)      reg(A1p, r11)     reg(iA1p, r18)
reg(Bp, r12)      reg(B0, r12)      reg(B1p, r13)     reg(iB1p, r16)
reg(Cp, r14)      reg(C0, r14)      reg(C1p, r15)     reg(iC1p, r16)
reg(Dp, r16)      reg(D0, r16)      reg(D1p, r17)
reg(AAp, r10)     reg(AA0p, r10)    reg(AA1p, r11)
reg(BBp, r8)      reg(BB0p, r8)     reg(BB1p, r9)
reg(CCp, r16)     reg(CC0p, r16)    reg(CC1p, r17)
reg(DDp, r14)     reg(DD0p, r14)    reg(DD1p, r15)
```

```
/* DEQUANTIZATION AND IDCT OF 8 x 8 BLOCK                    $ means operand bypasses register file      */
/*                                                           % means operand is shared between 2 ops     */
                                                        BUTTERFLYS              MULTIPLIES
      ori (loopcnt, r0, 25
   l:dmac (rT, Bp, dX0,    r0, r0            )/*       Bp =b(X3p, X5p)      dX0  =dmac (X0)          */
      dmac (nT, AA, dX3,           A0,B0     )/*/*1    AA =b(A0, B0)        dX3  =dmac (X3)          */
      dmac (rT, Ap, dX5,   r0, r0            )/*/*2    Ap =b(X1p, X7p)      dX5  =dmac (X5)          */
      dmac (nT, C, r0,     cX2, cX6, dX4     )/*/*3    C  =b(cX2, cX6)      $cX4 =cmac (dX4)         */
      cmac (nT, Cp, dX1,   r0, r0            )/*/*4    Cp =b(X2p, X6p)      dX1  =dmac (X1)          */
      dmac (rT, Cp, dX1,   r0, r0            )/*/*5    BB =b(iA1, iB1)      $iC1 =imac (C1, C0)      */
      imac (nT, BB, r0,    iA1, iB1, C1      )/*/*6    D  =b(cX0, $cX4)     dX7  =dmac (X7)          */
      dmac (BnT, D, dX7,cX0, C0              )/*/*7    Dp =b(X0p, X4p)      $iAA1=imac (AA1, BB0)    */
      imac (rT, Dp, r0,           r0, r0, AA1)/*/*8    CC =b(D1, $iC1)      cX00 =cmac (dX0)         */
      cmac (BnT,CC, cX00, D1, BB0, dX0       )/*/*9    DD =b(D0, C0)        $iBB1=imac (BB1, AA0     */
      imac (nT, DD, r0,           D0, C0, BB1)/*/*10   AAA=b(CC1, $iAA1)    iB1p =imac (B1p, %B0p)   */
      imac (BwT, r0, iB1p, CC1, AA0, B1p     )/*/*11   AAp=b(A0p, %B0p)     iA1p =imac (A1p, A0p)    */
      imac (nT, AAp, iA1p, A0p, B0p, A1p     )/*/*12   BBB=b(DD1, $iBB1)    iC1p =imac (C1p, %C0p)   */
      imac (BwT, r0, iC1p, DD1, A0p, C1p     )/*/*13   DDp=b(D0p, %C0p)     dX2  =dmac (X2)          */
      dmac(nT, DDp, dX2, D0p, C0p            )/*/*14   DDD=b(DD0, AA0)      dX6  =dmac (X6)          */
      dmac (wT, r0, dX6, DD0, AA0            )/*/*15   BBp=b(iA1p, iB1p)    cX3  =cmac (dX3)         */
      cmac (nT, BBp, cX3,       iA1p, iB1p, dX3)/*/*16  CCC=b(CC0, BB0)     $cX5 =cmac (dX5)         */
      cmac (wT, r0, r0,  CC0, BB0, dX5       )/*/*17   CCp=b(D1p, iC1p)     cX1  =cmac (dX1)         */
      cmac (nT, CCp, cX1, D1p, iC1p, dX1     )/*/*18   DDDp=b(DD0p, AA0p)   $cX7 =cmac (dX7)         */
      cmac (wP, r0, r0,    DD0p, AA0p, dX7   )/*/*19   B  =b(cX3, $cX5)     $iAA1p=imac (AA1p, %BB0p)*/
      imac (BnT, B, r0,    cX3, r0, AA1p     )/*/*20   CCCp=b(cX1, $cX7)    cX2  =cmac (dX2)         */
      cmac (wP, r0, r0,    cX2, CC0p, BB0p, dX2)/*/*21  A =b(cX1, $cX7)     $iBB1p=imac (BB1p, AA0p) */
      imac (BnT, A, r0,          cX1, r0, BB1p)/*/*22  AAAp=b(CC1p, $iAA1p) cX6  =cmac (dX6)         */
      cmac (BwP, r0, cX6,CC1p, AA0p, dX6     )/*/*23   cX0 =b(cX00, 0)      iB1  =imac (B1, B0)      */
      imac (nT,cX0, iB1,  cX00, r0, B1       )/*/*24   BBBp=b(DD1p, $iBB1p) iA1  =imac (A1, A0)      */
      imac (BwP, r0, iA1, DD1p, B0, A1       )/*/*25                        dX4  =dmac (X4)          */
      dmac (nT, r10, dX4, r0, A0             )/*/*26                                                 */
      subi (loopcnt, loopcnt, 1
      bnz (l)
```

FIGURE 7-2

DECODER FOR COMPRESSED VIDEO SIGNALS

CROSS REFERENCE TO RELATED APPLICATIONS

This Application is a continuation-in-part of U.S. patent application, entitled "Decompression Processor for Video Applications", Ser. No. 07/669,818, filed Mar. 15, 1991, attorney docket no. M-1421 U.S., hereby incorporated by reference in its entirety, now abandoned.

BACKGROUND OF THE INVENTION

1. Field of the Invention

The present invention relates to digital signal processing, and in particular, relates to the decompression of video signals.

2. Discussion of the Related Art

Motion pictures are provided at thirty frames per second to create the illusion of continuous motion. Since each picture is made up of thousands of pixels, the amount of storage necessary for storing even a short motion sequence is enormous. As a higher definition image is desired, the number of pixels in each picture is expected to grow also. Fortunately, taking advantage of special properties of the human visual system, lossy compression techniques have been developed to achieve very high data compression without loss of perceived picture quality. (A lossy compression technique involves discarding information not essential to achieve the target picture quality). Nevertheless, the decompression processor is required to reconstruct in real time every pixel of the stored motion sequence.

The Motion Picture Experts Group (MPEG) provides a standard (hereinbelow "MPEG standard") for achieving compatibility between compression and decompression equipment. This standard specifies both the coded digital representation of video signal for the storage media, and the method for decoding. The representation supports normal speed playback, as well as other play modes of color motion pictures, and reproduction of still pictures. The standard covers the common 525- and 625-line television, personal computer and workstation display formats. The MPEG standard is intended for equipment supporting continuous transfer rate to 1.5 Mbits per second, such as compact disks, digital audio tapes, or magnetic hard disks. The MPEG standard is intended to support picture frames of approximately 288×352 pixels each at a rate between 24 Hz and 30 Hz. A publication by the International Standards Organization (ISO) entitled "Coding for Moving Pictures and Associated Audio—for digital storage media at up to about 1.5 Mbit/s," included herein as Appendix A, provides in draft form the proposed MPEG standard, which is hereby incorporated by reference in its entirety to provide detailed information about the MPEG standard.

Under the MPEG standard, the picture frame is divided into a series of "Macroblock slices" (MBS), each MBS containing a number of picture areas (called "macroblocks") each covering an area of 16×16 pixels. Each of these picture areas is represented by one or more 8×8 matrices which elements are the spatial luminance and chrominance values. In one representation (4:2:0) of the macroblock, a luminance value (Y type) is provided for every pixel in the 16×16 pixels picture area (in four 8×8 "Y" matrices), and chrominance values of the U and V (i.e., blue and red chrominance) types, each covering the same 16×16 picture area, are respectively provided in an 8×8 "U" matrix and an 8×8 "V" matrix. That is, each 8×8 U or V matrix covers an area of 16×16 pixels. In another representation (4:2:2), a luminance value is provided for every pixel in the 16×16 pixels picture area, and two 8×8 matrices for each of the U and V types are provided to represent the chrominance values of the 16×16 pixels picture area.

The MPEG standard adopts a model of compression and decompression shown in FIG. 1. As shown in FIG. 1, interframe redundancy (represented by block 101) is first removed from the color motion picture frames. To achieve interframe redundancy removal, each frame is designated either "intra", "predicted", or "interpolated" for coding purpose. Intra frames are least frequently provided, the predicted frames are provided more frequently than the intra frames, and all the remaining frames are interpolated frames. The compressed video data in an intra frame ("I-picture") is computed only from the pixel values in the intra frame. In a predicted frame ("P-picture"), only the incremental changes in pixel values from the last I-picture or P-picture are coded. In an interpolated frame ("B-picture"), the pixel values are coded with respect to both an earlier frame and a later frame. By coding frames incrementally, using predicted and interpolated frames, much interframe redundancy can be eliminated to result in tremendous savings in storage. Motion of an entire macroblock can be coded by a motion vector, rather than at the pixel level, thereby providing further data compression.

The next steps in compression under the MPEG standard remove intraframe redundancy. In the first step, represented by block 102 of FIG. 1, a 2-dimensional discrete cosine transform (DCT) is performed on each of the 8×8 values matrices to map the spatial luminance or chrominance values into the frequency domain.

Next, represented by block 103 of FIG. 1, a process called "quantization" weights each element of the 8×8 matrix in accordance with its chrominance or luminance type and its frequency. The quantization weights are intended to reduce to zero many high frequency components to which the human eye is not sensitive. Having created many zero elements in the 8×8 matrix, each matrix can now be represented without information loss as an ordered list of a "DC" value, and alternating pairs of a non-zero "AC" value and a length of zero elements following the non-zero value. The list is ordered such that the elements of the matrix are presented as if the matrix is reading a zig-zag manner (i.e., the elements of a matrix A are read in the order A00, A01, A10, A02, A11, A20 etc.). This representation is space efficient because zero elements are not represented individually.

Finally, an entropy encoding scheme, represented by block 104 in FIG. 1, is used to further compress the representations of the DC block coefficients and the AC value-run length pairs using variable length codes. Under the entropy encoding scheme, the more frequently occurring symbols are represented by shorter codes. Further efficiency in storage is thereby achieved.

Decompression under MPEG is shown by blocks 105–108 in FIG. 1. In decompression, the processes of entropy encoding, quantization and DCT are reversed, as shown respectively in blocks 105–107. The final step, called "absolute pixel generation" (block 108), provides the actual pixels for reproduction, in accordance to the play mode (forward, reverse, slow motion e.g.), and the physical dimensions and attributes of the display used.

Further, since the MPEG standard is provided only for noninterlaced video signal, in order to display the output motion picture on a conventional NTSC or PAL television set, the decompressor must provide the output video signals in the conventional interlaced fields. Guidelines for decompression for interlaced television signals have been proposed as an extension to the MPEG standard. This extended standard is compatible with the International Radio Consultative Committee (CCIR) recommendation 601 (CCIR-601).

Since the steps involved in compression and decompression, such as illustrated for the MPEG standard discussed above, are very computationally intensive, for such a compression scheme to be practical and widely accepted, the decompression processor must be designed to provide decompression in real time, and allow economical implementation using today's computer or integrated circuit technology.

SUMMARY OF THE INVENTION

In accordance with the present invention, an apparatus and a method provide decoding of compressed discrete cosine transform (DCT) coefficients encoded as variable length codes.

In one embodiment, the apparatus comprises a microcoded central processing unit controlling a number of coprocessing units communicating over a global bus. The coprocessing units include (i) a host bus interface unit for receiving a stream of variable length codes, (ii) a memory controller for controlling an external random access memory for storing and retrieving the received stream of variable length codes, (iii) a decompressor and decoder for transforming the compressed variable length codes into DCT coefficients, (iv) an inverse discrete cosine transform processor for transforming the DCT coefficients into pixel values and (v) a pixel filter and motion compensation unit for resampling the pixel values, and for reconstructing the encoded motion sequence based on information in the reference (intra) frames of the motion sequence.

In accordance with another aspect of the present invention, the dequantization and the inverse cosine transform functions are performed by a combination of general purpose and special purpose hardware in the central processing unit. In addition, the inverse cosine transform function is performed by a structure comprising (i) a first stage, which receives as operands first, second and third data to compute a result equalling the product of the first and second data less the third data, and (ii) a second stage, which receives the result from the first stage and compute both the sum and the difference of a fourth datum and the result from the first stage. In one embodiment, the first, second and third data are obtained from a register file, and the results of the first and second stages are returned to the register file, except when the central processing unit directs that the result from the first stage not to be returned ("bypass") to the register file.

In accordance with another aspect of the present invention, the memory controller, which controls a memory system and serves a number of coprocessing units, allocates for each coprocessing unit a first-in-first-out memory so as to separately queue memory access requests for the associated coprocessing unit. A priority circuit in the memory controller grants, under a predetermined priority scheme, memory access to the memory request in the queue having the highest priority. For a memory access request requiring multiple accesses to the memory system, the multiple accesses to the memory system can be preempted by a higher priority memory access request which arrives at the memory controller prior to the completion of the multiple accesses.

In accordance with another aspect of the present invention, the decoding of variable length codes by the decompressor and decoder is controlled by the contents of accessed memory words in a control memory system, such as a read-only memory, which also stores decoded values of the variable length codes. Initially, the decompressor and decoder accesses the control memory system using an address formed by a predetermined number of bits from the code stream and a predetermined bit pattern according to the command received from the central processing unit. The accessed word in the control memory system is then used to determine if further memory accesses are required. Each word thus accessed contains a decoded value of a variable length code, control information or both. If a further access to the control memory system is necessary, the new access is accomplished using an address formed by a predetermined number of bits obtained from the code stream and a portion of the content of the most recently accessed word in the control memory system. In one embodiment, where a variable length code ("run length") encodes a number of zero values, the accessed words of the control memory system in this decoding method controls the output of these zero values.

The present invention is better understood upon consideration of the detailed description below and the accompanying drawings.

BRIEF DESCRIPTION OF THE DRAWINGS

FIGS. 3a and 3b show respectively the data flow of CPU 201 and a map of the register file in CPU 201 indicating the contents of registers used in the instruction cycles of the IDCT operation.

in FIG. 4, a 1-dimensional IDCT is performed on eight DCT coefficients constituting a row or a column of an 8×8 block of DCT coefficients.

FIG. 7 is a microprogram for computing IDCT in CPU 201, using the IDCT algorithm of FIG. 4, in accordance with the present invention.

DETAILED DESCRIPTION OF THE PREFERRED EMBODIMENT OVERVIEW

Figure 1:
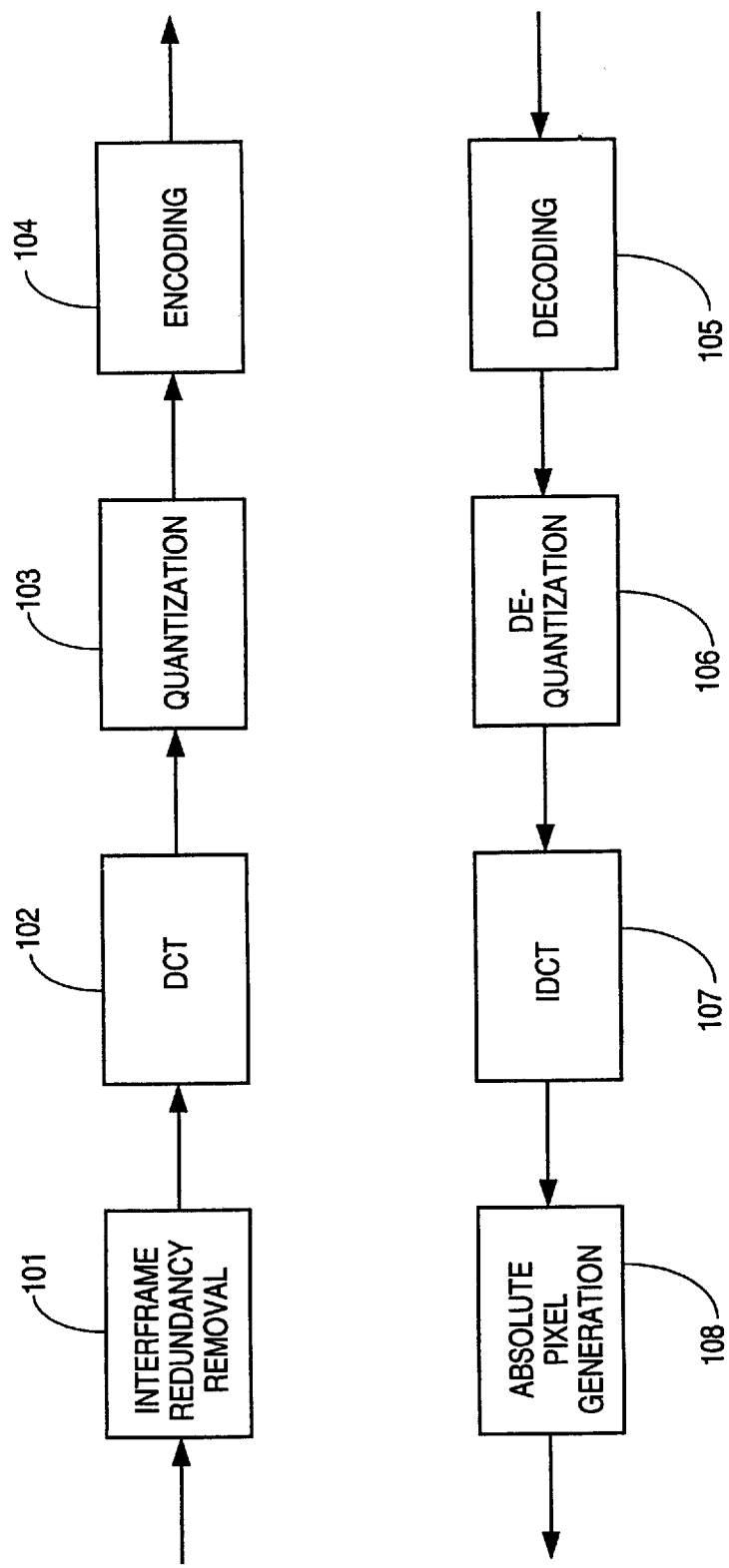
FIG. 1 is a model of the compression and decompression processes under the MPEG standard.
Figure 2:
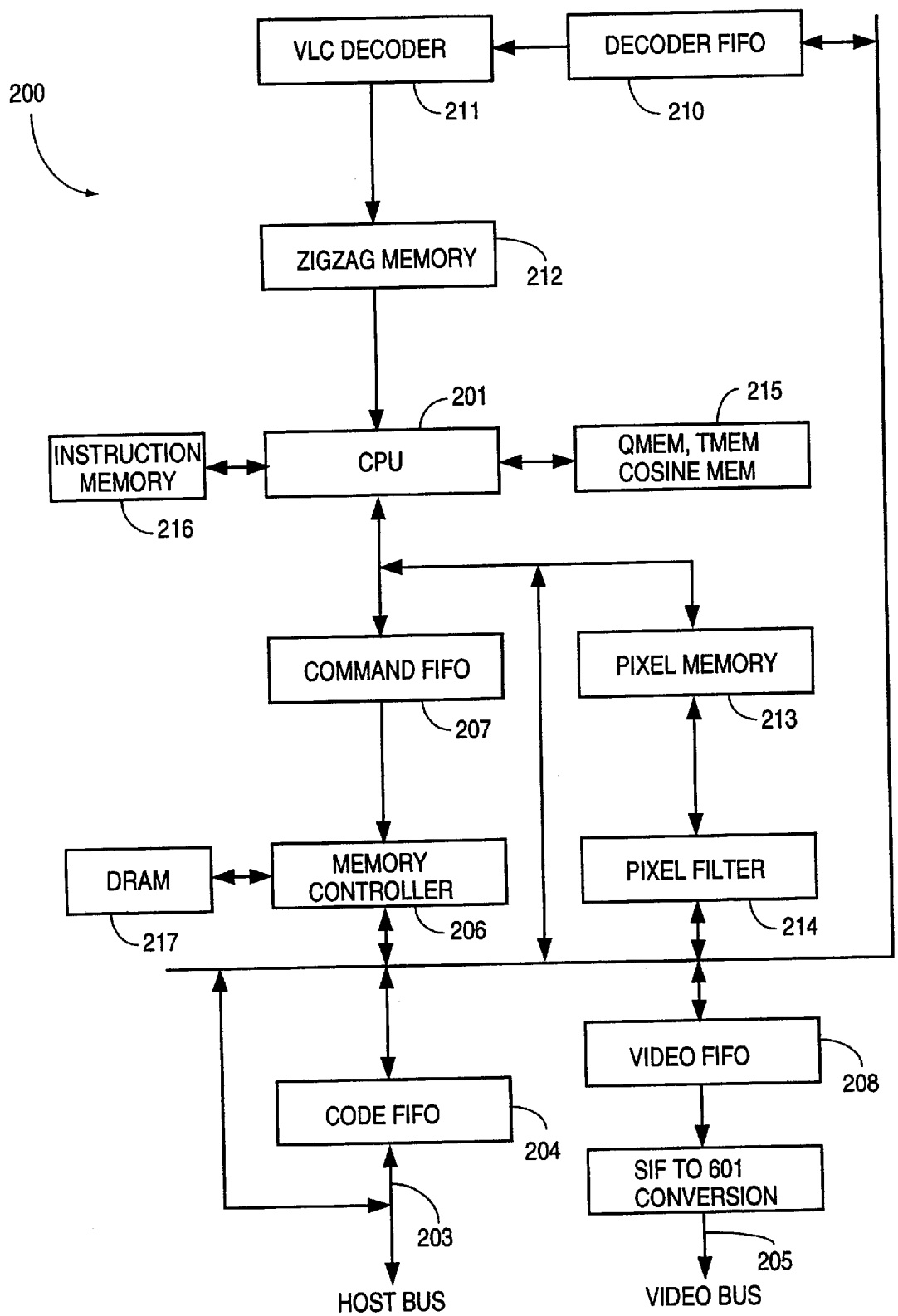
FIG. 2 is a block diagram of a video decompressor circuit 200 in accordance with the present invention.

A block diagram of an embodiment of the present invention is shown in FIG. 2. As shown in FIG. 2, a video decoder 200 comprises a central processing unit (CPU) 201, and interfaces with a host computer 202 (not shown) over host bus 203. Host computer 202 provides a stream of compressed video data, which is received by video decoder 200 into a first-in-first-out (FIFO) memory 204 ("code FIFO"). The compressed data received from host computer 202 is decompressed by video decoder 200 and the decompressed video data is provided as video decoder 200's output data over a video bus 205.

Video decoder 200's CPU 201 is a microcoded processor having a control store ("instruction memory") 216. CPU 201 sends commands over a FIFO memory 207 ("command FIFO") to a memory controller 206 ("DRAM controller"), which controls a memory module 217 ("DRAM"). In this embodiment, DRAM 217 comprises dynamic random access memory components, although other suitable memory technologies for implementing a memory system can also be used. DRAM 217 stores both the compressed data received from host computer 202 and the decompressed data for output to video bus 205. The decompressed data for output to video bus 205 are queued in an output FIFO memory 208 ("Video FIFO").

In this embodiment, the functional modules of video processor 200 communicate over a global-bus 209. Control of global bus 209 is granted under a priority scheme to either DRAM controller 206, host bus computer 202, or CPU 201. During operation, compressed video data received from host computer 202 are stored into DRAM 217 by DRAM controller 206 under CPU 201's command. This compressed data is retrieved from DRAM 217 under CPU 201's direction into variable length code (VLC) decoder 211 over a FIFO memory 210 ("decoder FIFO") for decompression. In accordance with the MPEG standard, the decompressed data is reordered by first being stored in "zigzag" order into a memory 212 ("zigzag memory") and then retrieved in row-major order from zigzag memory 212. The row-major ordered decompressed data are then provided to CPU 201 where the decompressed data is "dequantized" and transformed by a 2-dimensional inverse discrete cosine transform (IDCT). The IDCT converts the decompressed DCT coefficients from a frequency domain representation to a spatial domain ("pixel space") representation. In performing the dequantization and IDCT operations, CPU 201 retrieves from a local memory dequantization, cosines and other constants. Temporary storage is also provided by memory unit 215 to store intermediate results of the 2-dimensional IDCT. Memory unit 215 represents a quantization memory 215a, a temporary memory unit 215b, and a cosine memory 215c. The dequantization and the IDCT operations are explained in further detail below.

The pixel space decompressed data are stored into a FIFO memory 213 ("pixel memory"). These pixel space data ("pixels") are filtered and "motion-compensated" by pixel filter 214. The operations of the filtering and motion compensation are discussed in further detail below. Under the direction of CPU 201, DRAM controller 206 stores motion compensated pixels of pixel filter 214 into DRAM 217. The pixels are later retrieved from DRAM 217 by DRAM controller 206, under CPU 201's direction, to provide over global bus 209 to video FIFO 208 as output data of video decoder 200. A CCIR 601 conversion module provides, as a user selectable option, conversion of the decompressed output video data into video data conforming to the CCIR 601 format. The user of the present embodiment can select a 352×240 image at a frame rate of 30 frames per second, or a 704×240 image at a frame rate of 60 frames per second (i.e. CCIR 601 format). Conversion to the CCIR 601 is achieved by both horizontal interpolation and frame rate conversion techniques.

Internal Global Bus

Global bus 209 is driven from three sources: host computer 202, CPU 201, and DRAM controller 206. Internal global bus comprises an 8-bit address bus GSEL 209a and a 16-bit data bus GDATA 209b. Two clock periods prior to accessing global bus 209, the unit requesting access asserts a request bit. In accordance with a predetermined priority scheme, in the next clock period, the requesting unit having the highest priority drives onto address bus GSEL 209a the address of the module to which (or from which) the requesting unit desires to send or (receive) data. Separate GSEL addresses are provided for read and write operations. Data are driven onto data bus GDATA 209b by the source of data (i.e. the requesting unit in a write operation, or accessed module in a read operation) in the clock period after the address on address bus GSEL 209a is provided.

In this embodiment, since two clock periods are required per access to DRAM 217, the maximum rate at which data can be written to or requested from DRAM controller 206 is every other clock period.

Host Bus Interface

In this embodiment, code FIFO 204 is 2-bytes wide and holds 32 bytes of compressed code. Host bus interface 203 comprises a 20-bit address bus 203a, a 16-bit data bus 203b, and control signals for performing data transfers or signalling interrupts. Host bus interface 203 includes a host processor clock, a chip clock, a system clock, an address valid strobe (AS) signal, a read/write (R/W) signal, data ready signals UDS and LDS, a reset signal and a test signal. Host computer 202 transfers compressed video data by writing into code FIFO 204 under DMA mode. The compressed video data are transferred on the 16-bit data bus 203b under DMA mode at a rate of 16 bits per bus write cycle. A non-DMA transfer is used by host computer 202 to perform control functions, to access code FIFO 204, and to access DRAM 217 via DRAM controller 206.

Several control registers are accessed by host bus 202 to perform control functions. These registers include: (i) a DMA control register, which allows host computer 202 to enable or disable DMA to code FIFO 204 and to query the status of the code FIFO 204; (ii) a vectored interrupt register, which allows video decoder 200 to perform a vectored interrupt on the host processor; and (iii) a system timer register, which allows host computer 202 to synchronize the compressed video data stream with other MPEG data streams, such as audio.

To access under non-DMA mode any one of these control registers, DRAM 217, or code buffer 204, host computer 202 asserts the "AS," appropriately setting the R/W signal, and places an address on the 20-bit address bus. Bits [20:19] of the 20-bit address and the R/W signal indicate respectively the destination of the access and the access type. For a write access, host computer 202 places the data to be transferred on the 16-bit data bus and asserts data ready signals UDS and LDS. In response, Video decoder 200 latches the 16-bit data and acknowledges, thereby completing the host bus write cycle. For a read access, video decoder 200 acknowledges the AS signal when the requested data is ready at the 16-bit data bus 203b.

Central Processing Unit CPU 201 is a microcoded processor having a 24-bit data path and 32 general purpose registers ("register file"). In addition to controlling the co-processors, e.g. memory controller 206, CPU 201 also computes initial addresses for motion compensation (discussed in a later section) and performs dequantization and IDCT. As will be discussed below, both general purpose and special purpose hardware are provided in CPU 201. The general purpose hardware, which is used by both IDCT and non-IDCT computations, comprises the register file, an arithmetic logic unit (ALU) including a multiplier. The special purpose hardware, which is used in dequantization and IDCT computations, comprises a 5×8 multiplier-subtractor unit 601, a "butterfly" unit 602, cosine read-only memory (ROM) 215*c* and quantizer memory 215*a*.

CPU 201 provides special support for the dequantization and IDCT operations specified in the MPEG standard. Specifically, three multiply instructions are designed for these operations. Each multiply instruction also performs simultaneously a "butterfly" computation. A butterfly computation, as it is known in the art, is the simultaneous computation of a sum and a difference of two numbers. Butterfly computations are often encountered in digital filters.

Figure 4:
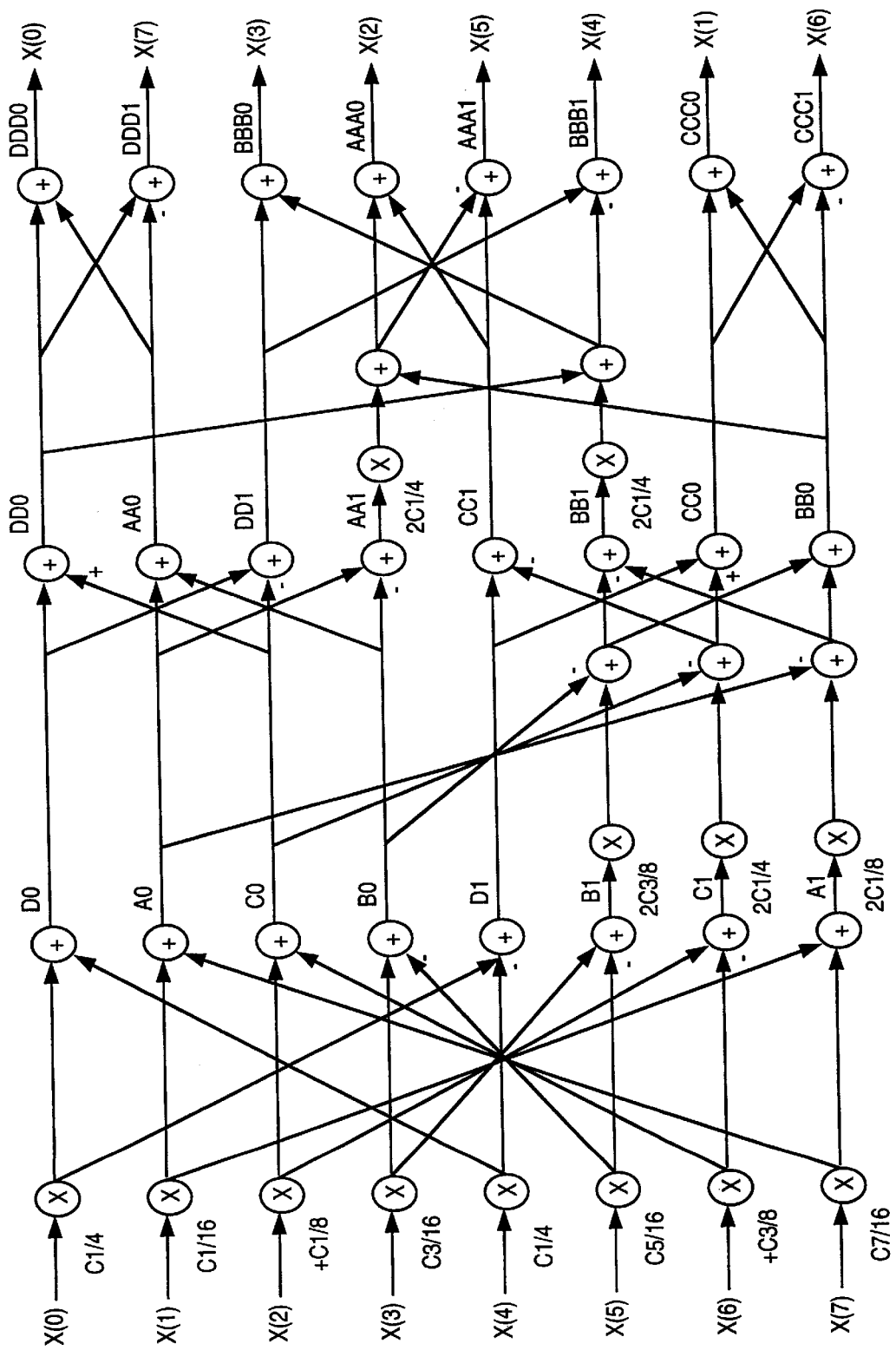
FIG. 4 is a flow diagram of one pass of an 8-point IDCT algorithm.

CPU 201 is programmed to perform an IDCT operation in accordance with a 8×8 pixel 2-dimensional IDCT algorithm disclosed in a copending U.S. patent application, entitled "A system for Compression and Decompression of Video Data Using Discrete Cosine Transform and Coding Techniques," by Alexandre Balkanski et al. Ser. No. 07/494,242, filed Mar. 14, 1990, now U.S. Pat. No. 5,196,946 issued Mar. 23, 1993 incorporated herein by reference. The IDCT operation is accomplished by performing two 1-dimensional IDCT operations, either row by row or column by column, on an 8×8 block or matrix of DCT coefficients. FIG. 4 is a flow diagram of the 8-point IDCT algorithm used to operate on one row or one column of the 8×8 block. As can be deduced from FIG. 4, for each row or column of DCT coefficients, 13 multiplications by a cosine factor and 12 butterfly operations are performed. In FIG. 4, the notation C3/16 denotes a multiplication by the cosine factor cosine(3*pi/16), where pi is the well-known mathematical constant 3.14159. . . .

Dequantization of the DCT coefficients are performed in accordance with the MPEG standard. The dequantization coefficients are stored in the quantization memory ("QMEM") 215*a*. Dequantization is achieved by multiplying each DCT coefficient in an 8×8 matrix with a corresponding dequantization constant.

Figure 5:
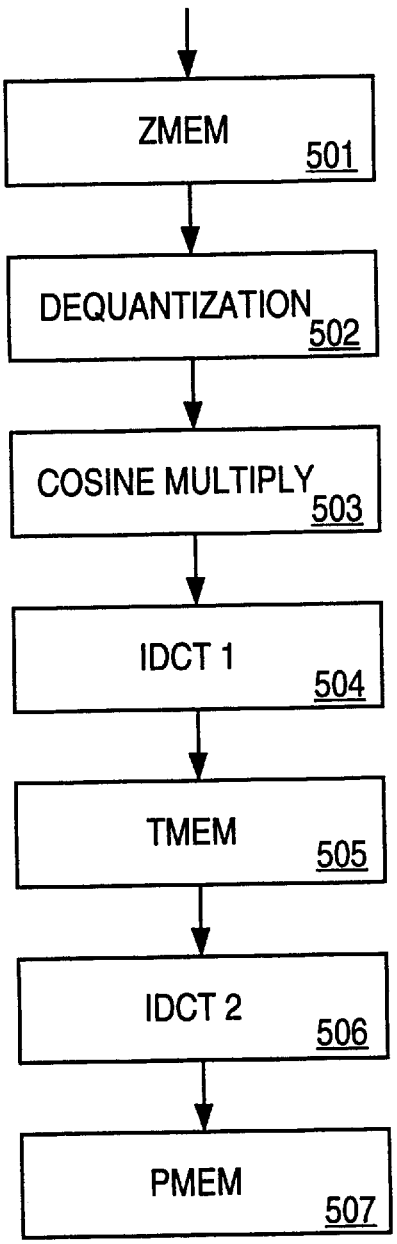
FIG. 5 shows the sequence of operations of the dequantization and the IDCT operations in CPU 201.

The data flow of the dequantization and IDCT operations are summarized in FIG. 5. As shown in FIG. 5, eight 9-bit DCT coefficients at a time, constituting a row of an 8×8 block of DCT coefficients, are retrieved from zigzag memory 212 at step 501. These DCT coefficients are dequantized at step 502 and multiplied by an appropriate cosine factor at step 503, prior to performing the first 1-dimensional IDCT on the DCT coefficients at step 504. The resulting eight DCT coefficients are then stored in temporary memory 215*b* at step 505 until the 1-dimensional IDCT is completed on every row of the 8×8 block. Then, eight DCT coefficients at a time, constituting a column of DCT coefficients of the 8×8 block, are retrieved at step 506 for the second 1-dimensional IDCT operation. At step 507, the resulting pixel values from the second 1-dimensional IDCT operation are provided to pixel memory 213.

In order to reduce the amount of storage necessary in temporary memory 215*b*, CPU 201 performs the 1-dimensional IDCT at step 504 alternating between row order for one 8×8 pixel block, and column order for the next 8×8 pixel block. Similarly, the second pass 1-dimensional IDCT operation at step 506 also alternates between column order and row order. Further, for a given 8×8 pixel block, the order in which the 1-dimensional IDCT is performed at step 504 is opposite to the order in which the 1-dimensional IDCT is performed at step 506.

Figures 1, 6A:
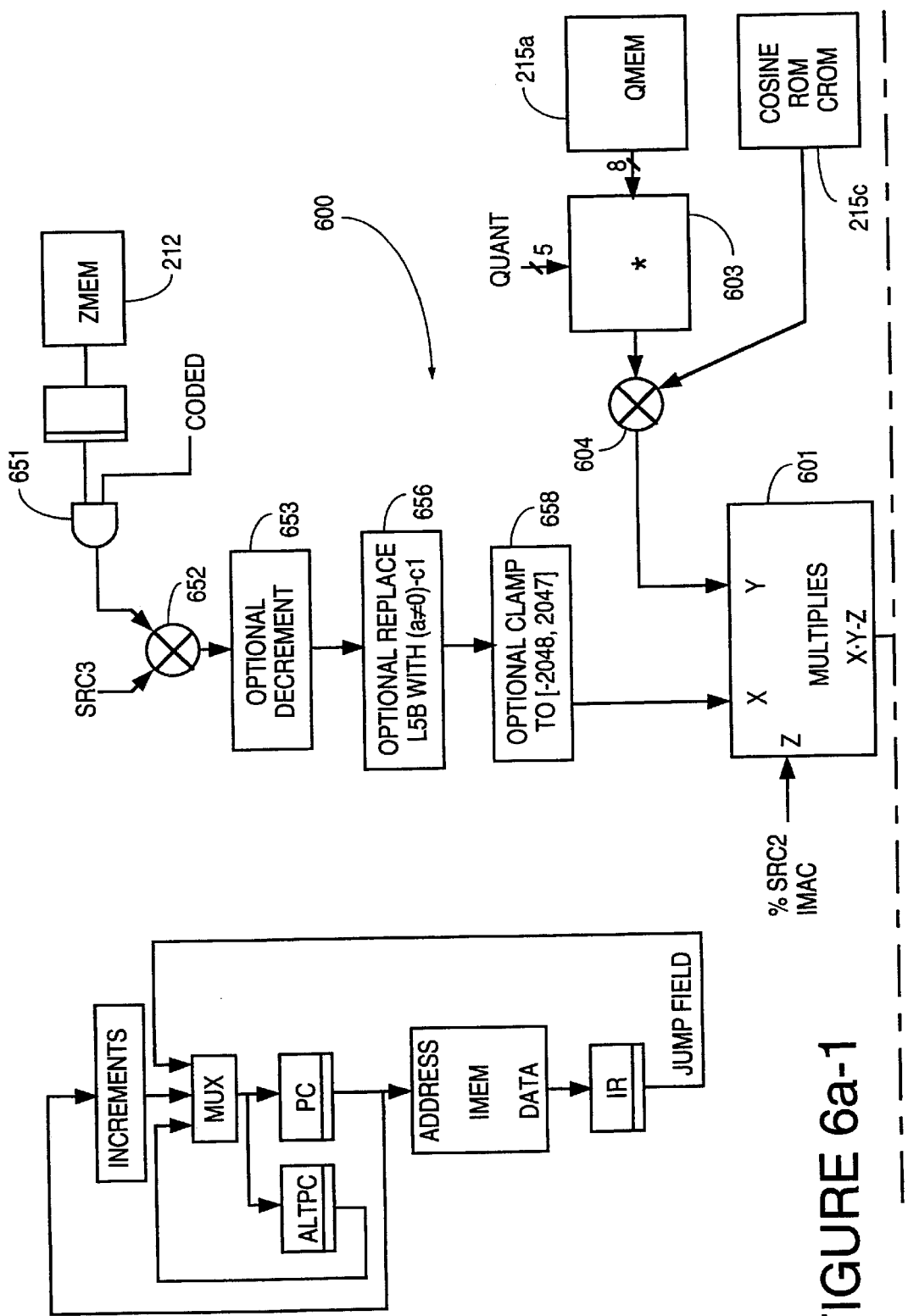
FIG. 6a shows circuit 600 which achieves in CPU 201 simultaneous multiplication and butterfly operations in accordance with the present invention.
Figures 2, 6A:
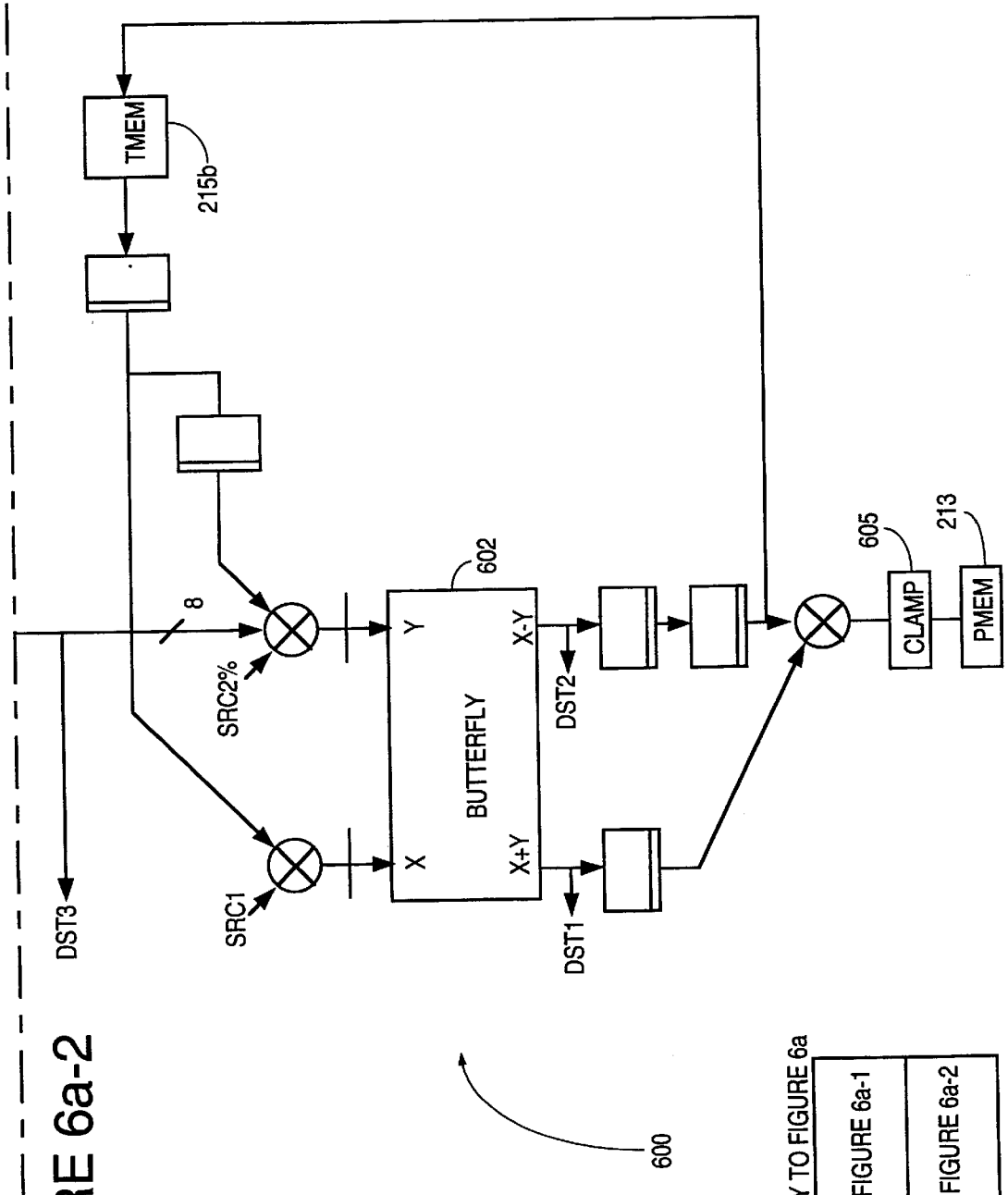

In the present embodiment, the dequantization, the cosine multiply, and the IDCT operations are performed by the same multiplier-subtractor unit of CPU 201. As discussed above, the multiplication instructions of the present embodiment also perform butterfly operations. The present embodiment achieves simultaneous multiplication 20 and butterfly operations using circuit 600 shown in FIG. 6*a*. Circuit 600 of FIG. 6*a* comprises a multiplier-subtractor unit 601 and a butterfly unit 602. As shown in FIG. 6*a*, during a dequantization instruction, dequantization constants are retrieved from quantization memory 215*a* and each scaled by a 5-bit scaling factor in multiplier 603. The scaled dequantization constant is then provided via multiplexer 604 to multiplier-subtractor unit 601 to be multiplied with the DCT coefficients retrieved from zigzag memory 212. Multiplexer 604 is set to select the dequantization constant during a dequantization instruction and is set to select a cosine factor during a cosine multiply operation. The cosine factor is retrieved from cosine memory 215*c*. In this embodiment, cosine memory 215*c* is implemented as a read-only memory.

Prior to arriving at multiplier-subtractor unit 601, in the first stage (shown in FIG. 6*b*) of circuit 600, each DCT coefficient may be decremented (box 653), made odd, rounded towards zero (box 656) or clipped to a predetermined range (box 658) according to the requirements of the MPEG standard. This first stage of circuit 600, comprising "gate" 651, multiplexer 652, decrementer 653, rounder 656, and clamp 658 are shown in greater detail in FIG. 6*b*.

Figures 1, 6B:
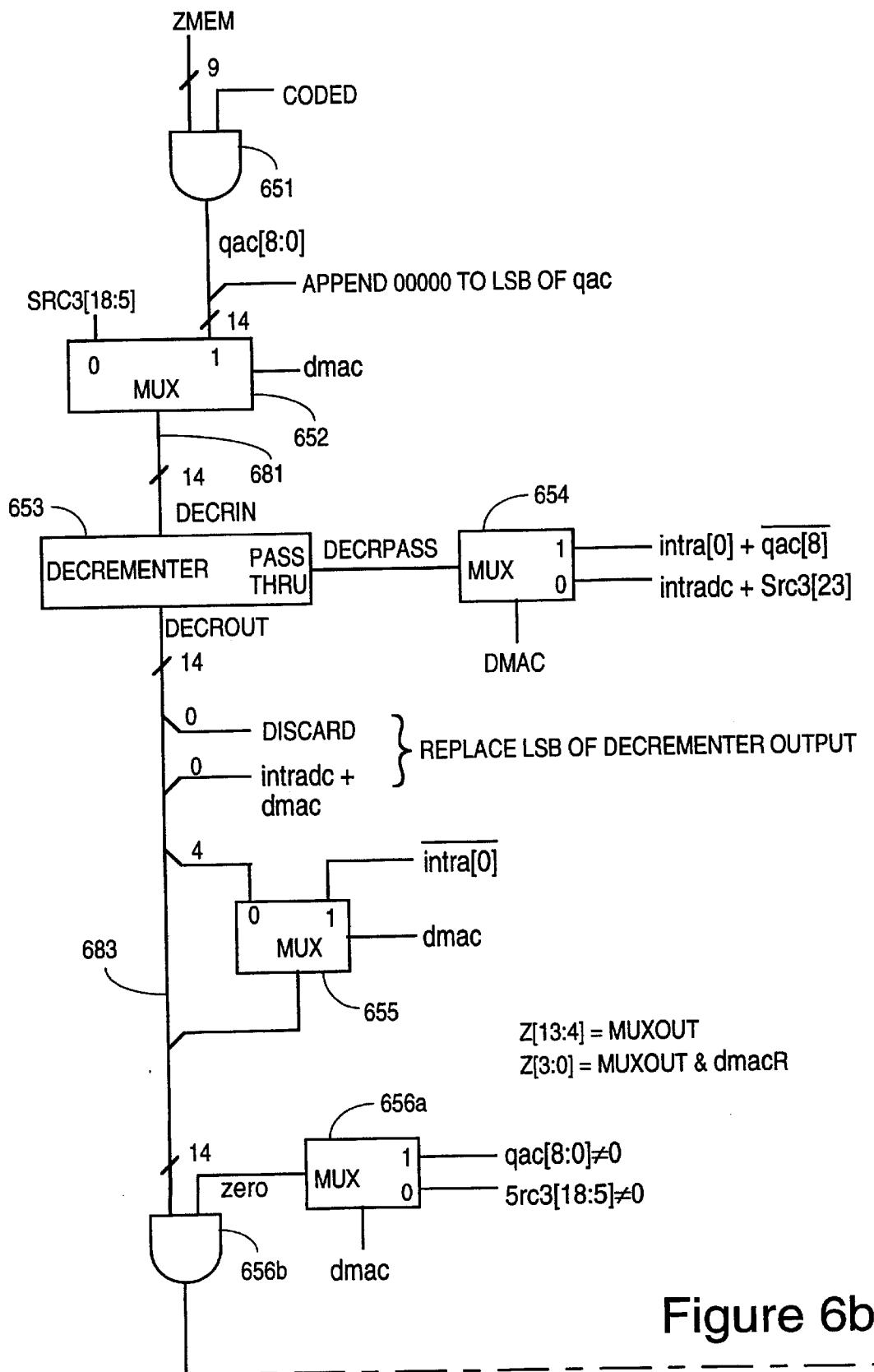
FIG. 6b shows the first stage of circuit 600 in CPU 201's data path.
Figure 6B:
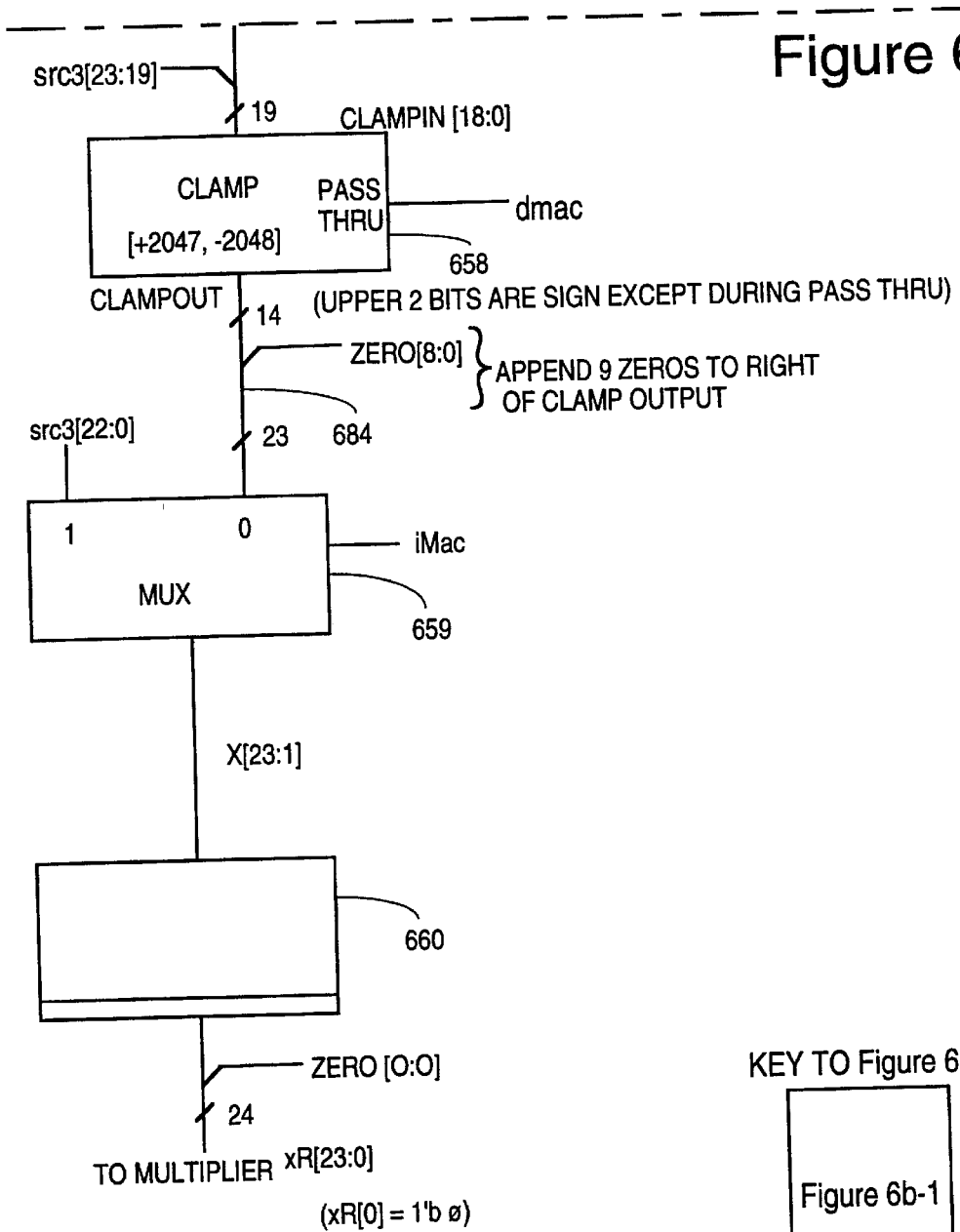
Figure 2:
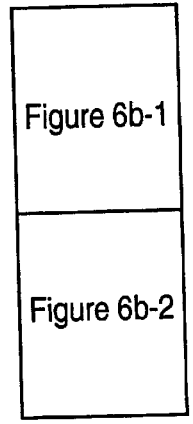

As shown in FIG. 6*b*, a 9-bit DCT coefficient from zigzag memory 212 can be set to zero by "gate" 651 in response to a control signal "coded". This 9-bit datum, after being zero-padded on the right to form a 14-bit datum, is selected by multiplexer 652 during the execution of a dequantization instruction onto 14-bit bus 681. Alternatively, when executing an instruction other than a dequantization instruction, multiplexer 652 selects the 14-bit datum of bus 682. This 14-bit datum during the execution of an instruction other than a dequantization instruction is the lower order 14 bits of a datum retrieved from a register ("source register") in the register file. The 14-bit datum on bus 681 is decremented by decrementer 653, when required by the MPEG standard, to provide a 14-bit output at the decrementer 653's output terminals. If a decrement operation is not required, the 14-bit datum on bus 681 is provided without modification at decrementer 653's output terminals.

Both bits 0 (LSB) and 4 of the output datum of decrementer 653 can be replaced according to the MPEG standard to provide a 14-bit datum on bus 683. The 14-bit datum on bus 683 can be zeroed by "gate" 656*b*, if the DCT coefficient from zigzag memory 212 is zero, during execution of a dequantization instruction, or the datum from the register file is zero, during execution of a non-dequantization instruction (e.g. a cosine multiply instruction). Bits 23:19 of the source register is prefixed to the 14-bit output datum of "gate" 656*b*, and the resulting 19-bit datum is clamped, during execution of a non-dequantization instruction, by clamp 658 to a 14-bit datum having values between −2048 and 2047, inclusive. Alternatively, during a dequantization instruction, the 14-bit output datum of "gate" 656*b* is passed through as the output datum of clamp 658. The output datum of clamp 658 is then zero-padded on the right to form a 23-bit datum on bus 684. Multiplexer 659 selects this 23-bit datum to the input terminals of register 660, unless the instruction being executed is a "imac" instruction (see below). During execution of an "imac" instruction, register 660 latches the least significant 23bits from the source register. The output datum of register 660 is provided as the "X" input datum to multiplier-subtractor unit 601.

Referring back to FIG. 6a, multiplier-subtractor unit 601 can, depending on the multiply instruction executed, multiply two numbers X and Y (e.g. in a dequantization, cosine or integer multiply instruction), or compute the value of the expression X*Y−Z (e.g. in an IDCT multiply-subtract instruction). The DCT coefficients are fetched from either zigzag memory 212 or temporary memory unit 215b to the register file. In addition, the resulting value from an operation in multiplier-subtractor unit 601 can be routed directly as an operand to butterfly unit 602 bypassing the register file.

The butterfly unit 602 computes simultaneously the sum and the difference of its two input operands. Since multiplier-subtractor unit 601 and butterfly unit 602 can each operate on their respective operands during the execution of a multiply instruction, a multiply instruction can result in both a multiplication result and a butterfly result. Additionally, a "pipeline" effect is achieved by using the output value (an "intermediate" result) of multiplier-subtractor unit 601 in a bypass instruction directly in the butterfly operation of the second instruction following the bypass instruction (multiplier-subtractor unit 601 has a latency of two instruction cycles). Under this arrangement, since the intermediate result is not loaded into and then read from a register of the register file, high throughput is achieved.

The results from a butterfly operation of a first pass IDCT are routed into the temporary memory 215b, whereas the results from a butterfly operation of a second pass IDCT operation are "clipped" by clamp 605 and routed to pixel memory 213.

FIG. 7 is a microprogram for computing the IDCT provided in FIG. 4. In FIG. 7, the dequantization, the cosine multiply and the IDCT operations are represented by the instructions shown in FIG. 7 as mnemonics "dmac", "cmac" and "imac" respectively. Additionally, instruction "reg(a,b)" assigns the register specified by argument "b" to the name specified in the argument "a". Comments for the microprogram are provided between the "/*" and "*/" symbols on each line. In the comment portion of the IDCT instructions, the operations performed in the butterfly unit 602 and the multiplier-subtractor unit 601 are set forth respectively under the headings "BUTTERFLYS" and "MULTIPLIES." In FIG. 7, in the IDCT portion of the microprogram (i.e. the portion where the instructions imac, dmac and cmac are invoked), the comment lines are numbered from 1–26, indicating the instruction cycles of the loop performing the IDCT. =FIG. 7 is read in conjunction with FIGS. 3a and 3b, which are respectively the data flow through the CPU 201 and a map of contents of registers in the register file. In FIG. 3a, each of the rows 1–26 corresponds to the corresponding numbered instruction cycle of the IDCT portion shown in FIG. 7. The first two columns, under headings "zmem" and "tmem," shows the operands fetched from zigzag memory 212 and temporary memory 215b respectively. Under the heading "pmem" is shown the result values of the IDCT written to pixel memory 213.

The operands under headings "A", "B," and "C" correspond respectively to the operands fetched from the register file to be provided at the X, Y inputs of butterfly unit 602, and the Z input of multiplier-subtractor unit 601.

The value under heading "E" corresponds to the result obtained from the output of the butterfly nit 602 Multiplier-subtractor unit 601 and 1st stage (651 to 658) form a 3-stage pipeline. Thus, the values under the headings "E1", "E2" and "E3" correspond to one of the operands in the operation performed respectively by the first, second, third stages of this 3-stage pipeline. Under the heading "R1", "R2" and "R3" are the results from the butterfly unit 602 and multiplier-subtractor unit 602 to be written to the register file.

R1 and R2 correspond to the sum and difference results from butterfly unit 602 and R3 corresponds to the result of multiplier-subtractor unit 601.

FIG. 3b is a map of the register file, showing the values stored in 16 registers R2–R17 during the instruction cycles of the IDCT portion of the microprogram shown in FIG. 7. Each of rows 1–26 shown in FIG. 3b shows the contents of registers R2–R17 during the correspondingly numbered instruction cycles of FIG. 7.

In FIG. 7, the dequantization instruction is represented by the instruction mnemonic "dmac(BTP, r12, r, a, b)", where:

(i) BTP is one of nT, rT, wT, wP, BnT, BrT, BwT and BwP, corresponding respectively to no memory read, read temporary memory 215b, write temporary memory 215b, write pixel memory 213, no memory read with bypass of the register file, read temporary memory 215b with bypass of the register file, write temporary memory 215b with bypass of the register file, and write pixel memory 213 with bypass of the register file;

(ii) "r12" is the address of one of the two registers in which the results of the butterfly computations are stored. Specifically, the register having address r12 stores the sum portion of the butterfly computation, and the register having address r12+1 stores the difference portion of the butterfly computation.

(iii) "r" is the address of the destination register of the dequantization operation, which multiplies the dequantization constant from QMEM 215a to the next DCT coefficient at the output FIFO of zigzag memory 212; and (iv) "a" and "b" are respectively the source registers of the associated butterfly computation.

In FIG. 7, the cosine multiply instruction "cmac" is represented by the instruction mnemonic "cmac(BTP, r12, r, a, b, c)". The arguments to the "cmac" instruction are substantially the same as those described above with respect to the "dmac" instruction. In executing a cosine multiply instruction, a cosine factor, determined by the position of the DCT coefficient in the 8×8 block, is multiplied with the content of the specified register "c" of the register file.

The IDCT instruction is represented in FIG. 7 by the instruction mnemonic "imac(BTP, r12, r, a, b, c)." The arguments to the "imac" instruction are substantially the same as those described above with respect to the "cmac" instruction, except that in executing the imac instruction, a cosine factor is multiplied to the content of the register specified by the argument "c." Before output, the resulting product is subtracted the content of the register specified by the argument "b" in the following instruction.

In FIG. 7, the variable names in the IDCT microcode follows the convention now being described. The variable names correspond to those of the values at the nodes of FIG. 4, except for names in the form Xi, dXi, and CXi, where i is a number from 0 to 7 inclusive. Specifically, Xi refers to a quantized DCT coefficient received from zigzag memory 212, dXi refers to the value of the DCT top coefficient Xi after being dequantized, and CXi refers to the value of the DCT coefficient Xi after being both dequantized and multiplied by a cosine factor. (Multiplication by a cosine factor is shown as the first step of the IDCT algorithm of FIG. 4).

In FIG. 7, a name having a suffix "p", e.g. "Ap" on line 3 of the IDCT portion of the microcode shown in FIG. 7, denotes a value in the second pass of the 2-dimensional IDCT algorithm. By contrast, a name not having a "p" suffix denotes a value in the first pass of the 2-dimensional IDCT. The results of the first and second passes of the IDCT are passed to temporary memory 215b and pixel memory 213 respectively.

The variable names assigned to the sum and difference results of a butterfly operation are respectively appended the designations "0" and "1." For example, on line 1 of the IDCT portion of the algorithm shown in FIG. 7, the comment's expression "Bp=b(X3p, X5p)" explains that the butterfly portion of the "dmac" operation takes the operands X3p and X5p and computes the sum and differences of these operands as, respectively, B0p and B1p.

Values that are used as both the input datum at the subtract input of multiplier-subtractor 601 and as an input to the butterfly unit 602 are indicated by the "%" sign in the comment portion of the IDCT operations in FIG. 7's microprogram. For example, on line 11 of the IDCT portion, the expression "iB1p=imac(B1p, %B0p)" explains that the operand B0p in the multiplier-subtractor portion of the imac instruction is used in the next instruction. Thus, on line 12, it is shown the expression "AAp=(A0p, %B0p)" to indicate that the B0p is used as an operand in the butterfly portion of the imac instruction on line 12.

Finally, in FIG. 7, results of multiplier-subtractor unit 601 which are passed directly to the butterfly unit 602, bypassing the register file, are indicated by the "$" symbol. For example, on line 4, the expression "$cX4=cmac(dX4)" indicates that the result cX4 of the cosine multiply performed on operand dX4 is passed directly to butterfly unit 602, bypassing the register file.

Instruction Memory

Instruction memory 216, which stores the microcodes used for executing CPU instructions, comprises a static random access memory (SRAM). Instruction memory 216 is loaded by host computer 202 upon initialization of CPU 201. To effectuate a microcode change, when necessary, the microcodes in the SRAM can be overlayed by microcodes from the DRAM 217.

Memory Controller

DRAM controller 206 interacts directly with DRAM 217, generating the signals required to read and write the external DRAM 217. DRAM controller 206 receives from CPU 201 via command FIFO 207 a starting address and offset information. DRAM controller 206 computes subsequent addresses if multiple transfers are requested. In this manner, since CPU 201 need not generate every address for each memory access, CPU 201 is provided more bandwidth for IDCT operations.

Figure 8:
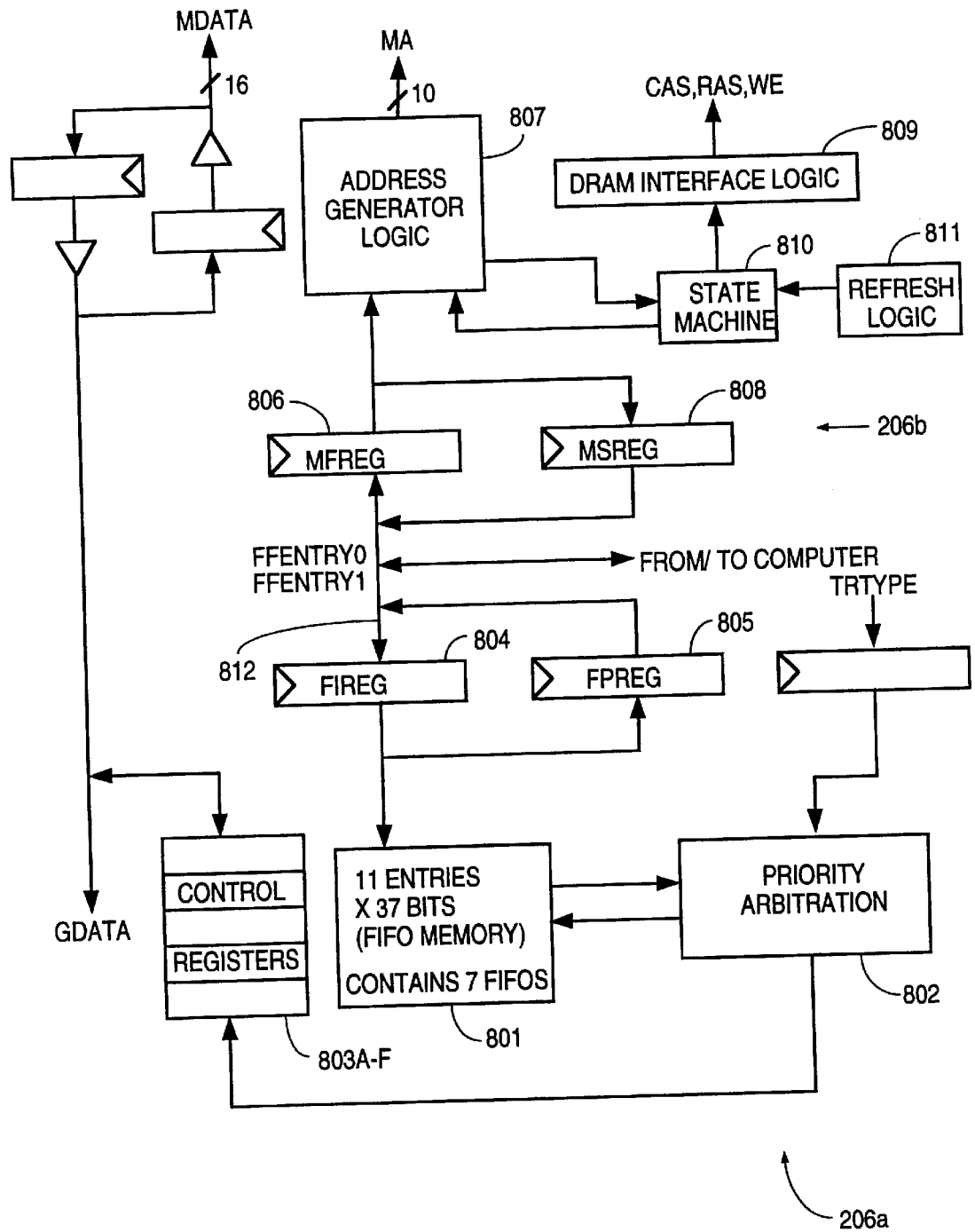
FIG. 8 is a block diagram of a memory controller, showing transfer request fifo (TRF) 207 and DRAM controller 206.

FIG. 8 is a block diagram of the memory controller module of the present embodiment. As shown in FIG. 8, the memory controller module comprises DRAM controller 206 and command FIFO 207, also known as transfer request FIFO (TRF) 207. A pending DRAM access is initiated by CPU 201 writing into memory buffer 801 of TRF 207 an entry indicating (i) the starting address of the DRAM access in bytes, (ii) whether the requested access is a read or write access, (iii) the number ("length") of memory words to be fetched, and (iv) if appropriate, an offset. In the present embodiment, memory buffer 801 holds 11 DRAM access request entries, allocated in order of priority to the following data source or destination: (i) one entry for luminance video FIFO 208a, (ii) one entry for code FIFO 204, (iii) one entry for decoder FIFO 210, (v) five entries for pixel memory FIFO 213, (iv) one entry for either a host memory request or CPU a memory request, and (vi) one entry for chrominance video FIFO 208b. For the purpose of understanding memory controller 206's operation, the entry or entries allocated to each source or destination can be regarded as a FIFO.

A DRAM access request becomes pending after (i) CPU 201 writes a memory access request entry into register 804, which is latched into memory buffer 801 and (ii) a request line corresponding to the data source or destination is asserted. A status register file 803a–803f provides for each request line a register to indicate whether or not a memory access request is pending. Since the present embodiment allocates five entries to pixel memory 213, five bits are provided to indicate the number of transfer requests related to pixel memory 213. Naturally, one bit is provided for each of the other status registers corresponding to the remaining data sources or destinations. By asserting a read request signal, the entries in memory buffer 801 can be read by CPU 201. The entry is read by CPU 201 from register 805.

Upon completion of each DRAM access, the length of the memory words to be fetched is decremented by one, except when the 3 least significant bits of the length field of the TRF entry is zero. A zero value in the length field of a TRF entry indicates that the specified offset is to be subtracted from the length after each memory access. Each entry in a TRF entry also indicates the transfer type and whether a byte write (i.e. only 8 of the 16 bits of the memory word are overwritten) is performed.

In this embodiment, host computer 202 can also request DRAM access in substantially the same manner as CPU 201 using a host request line, rather than CPU 201's request line, although host computer only writes into TRF 207 and does not read from TRF 207.

Priority arbitration among pending memory access requests are accomplished by priority arbitration circuit 802 according to the priority scheme set forth above. If DRAM controller 206 is idle, the highest priority request is sent by TRF 207 to DRAM controller 206 by writing into register 806. If a higher priority request is received by TRF 207 while DRAM 206 is processing a lower priority request, priority arbitration circuit 802 sends DRAM controller 206 a "higher priority request pending" signal. In this embodiment, if the current memory access crosses a page boundary while a higher priority request is pending, DRAM controller 206 returns the uncompleted lower priority request back to TRF 207, and begins processing the higher priority request.

TRF 207 issues a "code fifo emptying" request to transfer to DRAM 217 the content of code FIFO 204 when DRAM controller 206 is idle and no DRAM access request is pending at TRF 207. This code fifo emptying request can be issued so long as there is a valid TRF entry corresponding to a request of code FIFO 204 and code FIFO 204 contains at least one or more words, even though code FIFO 204's memory access request line is not asserted. The code fifo emptying request ensures that the last few words of the code FIFO 204 are transferred to DRAM 217.

DRAM controller 206 receives a DRAM access request from register 806, which is written by TRF 207. The format of a DRAM access request in register 806 is the same as the format of a TRF entry in memory buffer 801. Address generation logic 807 calculates subsequent memory addresses based on the starting address, length and offset information of the DRAM access request received. DRAM controller 206 is controlled by state machine 810, which also detects and handles, when the current DRAM access crosses a page boundary, preemption of the incomplete DRAM access request by another pending DRAM access request in the manner described above.

When DRAM controller 206 completes a DRAM access, a "memory request done" signal is sent to TRF 207 to allow TRF 207 to allocate the TRF entry in memory buffer 801 to a new request from the same source or destination as the completed DRAM access. In this embodiment, DRAM controller 206 sends an "almost done" signal at the following times: (i) a few cycles prior to completion of the current DRAM access, (ii) a "kill" signal aborting the current access is received from TRF 207, and (iii) a page crossing is expected during the current DRAM access, and a higher priority DRAM access request is pending. When the "almost done" signal is asserted, CPU 201's access to TRF 207 is disabled, to free bus 812 for communication between TRF 207 and DRAM controller 206.

DRAM controller 206 provides the necessary interface signals to DRAM 217 and controls DRAM 217's refresh activities. A refresh counter keeps tracks of the number of cycles before a refresh is due. If DRAM controller 206 becomes idle prior to the count in the refresh counter reaching zero, a DRAM refresh is performed. Alternatively, when the count in the refresh counter reaches zero, a DRAM refresh is performed after completion of the current DRAM access, or when a page boundary is crossed.

Variable Length Code (VLC) Decoder

Like DRAM controller 206 and Pixel filter 214, VLC decoder 211 serves as a slave processor to CPU 201. The instructions of VLC decoder 211 perform the following functions: (i) receive into decoder FIFO 210 under CPU 201's direction a stream of variable length code retrieved from DRAM 217; (ii) decode a variable length code according to the MPEG standard; (iii) construct 8×8 blocks of pixels for "unzigzaging" and dequantization in CPU 201; and (iv) providing up to 15 bits at a time the bits of the code stream.

Figures 1, 11:
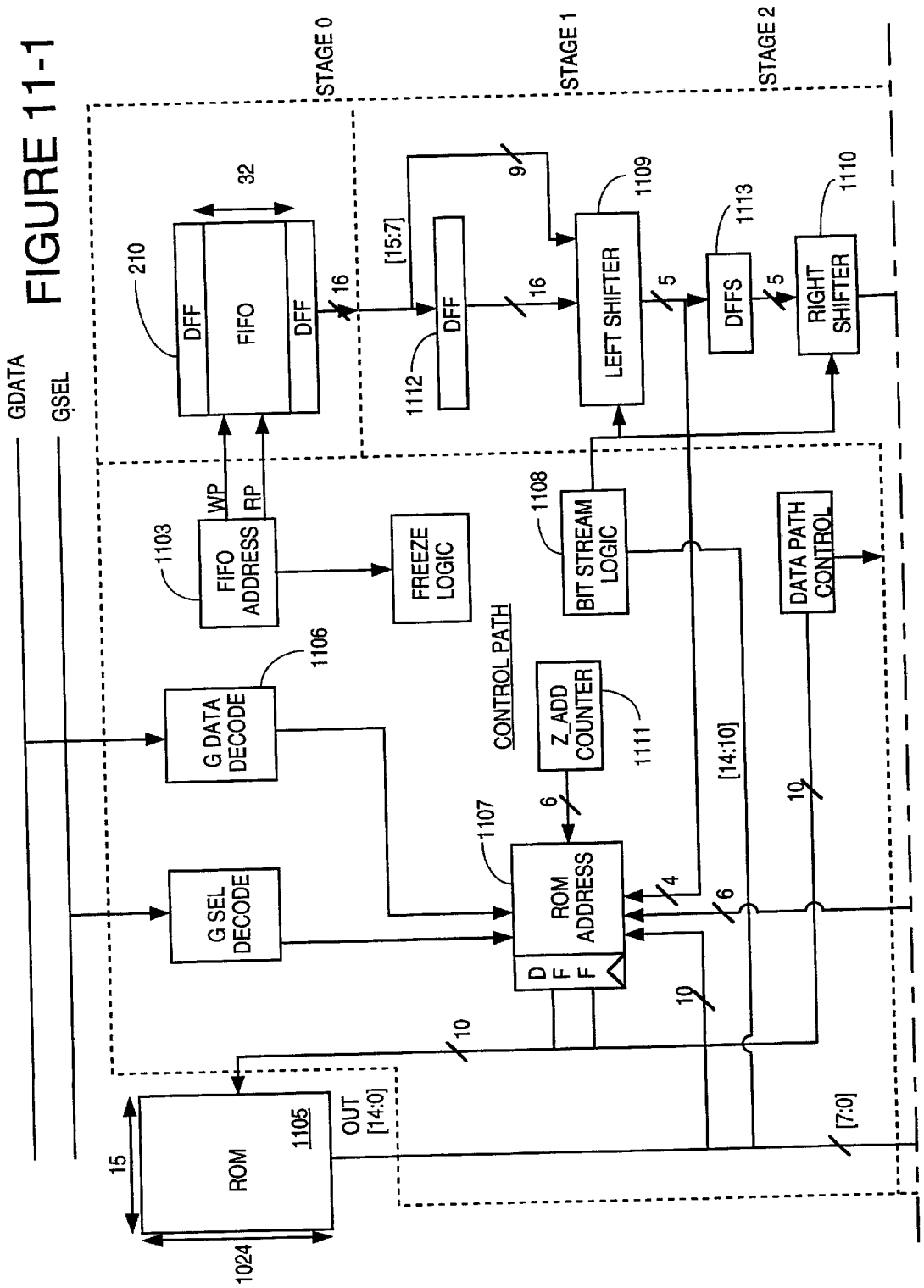
FIG. 11 is a block diagram of a VLC decoder module including VLC decoder 211 and decoder FIFO 208.
Figures 2, 11:
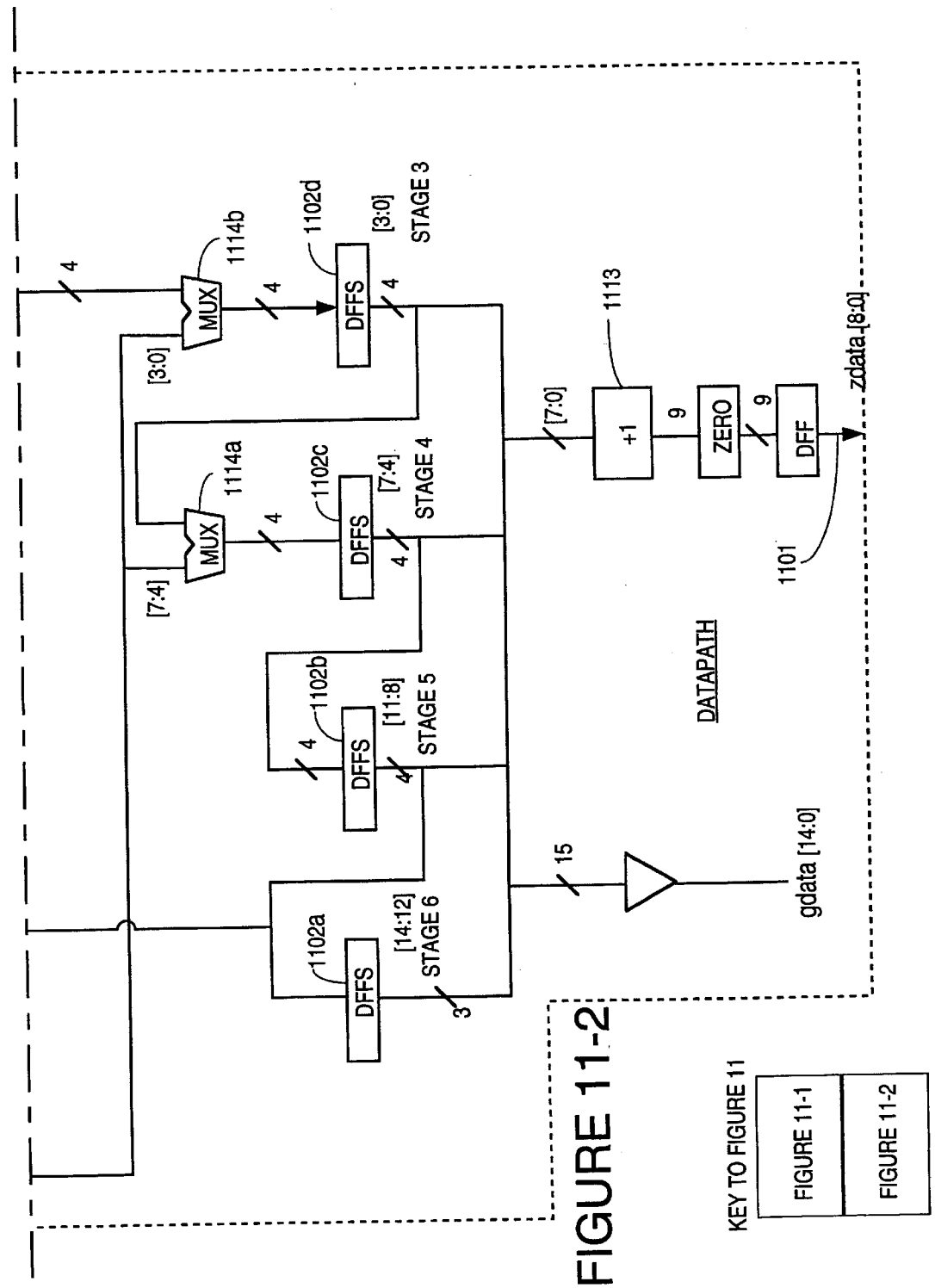

FIG. 11 shows VLC decoder module including VLC decoder 211 and decoder FIFO 210. As shown in FIG. 11, decoder FIFO 210 receives from DRAM 217 on global bus 209 a stream of variable length codes. Control information (i.e. commands) is also received from CPU 201 and stored in a decoder command register, which is part of global data decode unit 1106. The decoded values of certain variable length codes are provided to zigzag memory 212 on 9-bit zdata bus 1101. Other output values of VLC decoder 211 are provided on global bus 209. A status register (not shown) provides status information which can be accessed by CPU 201 through global bus 209.

Commands to VLC decoder 211 are 6-bit wide. When set, bit 5 (i.e. the most significant bit) resets VLC decoder 211. During normal operation, i.e. when bit 5 is zero, the lower 5 bits (4:0) encode either (i) one of fifteen "get bit" commands, which output 1–15 bits from the code stream to global bus 209, or (ii) the remaining VLC decoder commands. These remaining decoder commands are "mba" (macroblock address), "mtypei" (intraframe macroblock), "mtypep" (predictive frame macroblock), "mtypeh" (h.264 type macroblock), "mtypeb," (bidirectional macroblock), "mv" (motion vector), "cbp" (coded block pattern), "luma" (luminance block), "chroma" (chrominance block) and "non-intra" (block with no dc component)[1]. These remaining VLC decoder commands direct decoding by VLC decoder 211 the variable length code at the "head" of the code stream. Except for the "luma", "chroma" and "non-intra" commands, which decoded values are output on zdata bus 1101, the output decoded values of the VLC decoder 211's commands are stored in a decoder register (formed by registers 1102a–d) and provided to CPU 201 on global bus 209.

[1] Other than "mtypeh," these commands correspond to data objects defined in the MPEG standard. Mtypeh represents a macroblock defined under the h.264 standard which is used in teleconferencing applications.

In this embodiment, decoder FIFO 210 is a 32×16-bit FIFO, addressable by 5-bit write and read pointers, which are kept in fifo address logic unit 1103. Freeze logic unit 1104 suspends operation of VLC decoder 211 when decoder FIFO 210 is empty. VLC decoder 211 is controlled by a control store, shown in FIG. 11 as 1024×15-bit read-only memory (ROM) 1105, which also holds the decoded values of each variable length code. Decoding of variable length codes in ROM 1105 is performed by a table lookup.

In the embodiment shown in FIG. 11, if the command in the decoder command register is a "get bits" command (i.e. bit 4 of the command is zero), ROM address generator 1107 generates an address comprising (i) a preassigned bit pattern (in this case, 6-bit value 101011) and (ii) the least significant four bits of the command. Otherwise, if the-command is other than a "get bits" command, the 10-bit address comprises (i) two zero leading bits, (ii) the least significant four bits of the command and (iii) the first four bits at the head of the code stream.

Because the variable length codes decoded by VLC decoder 211 can be as long as 12 bits and, as can be seen from the ROM address generated, at most four bits of the code stream are used per access to ROM 1105, decoding a given variable length code may require multiple clocks and multiple accesses to ROM 1105. Other instructions, such as "luma," also require multiple clocks and multiple accesses to ROM 1105 to complete. The most significant bit (14) of the current word of ROM 1105 ("current ROM word"), when set, indicates either execution of the current command is complete, or if the current command is one of the block commands (i.e. either "luma," "chroma," or "non-intra"), a runlength is identified. When a run length is identified, a number of zeroes (equalling the run length identified) are "unpacked" for output on zdata bus 205. A block command requires the special handling described below.

Bits 13 and 12 of the current word encodes the number of bits to advance the head of the code stream. In the present embodiment, advancing the head of the code stream are performed by left and right shifters 1109 and 1110 respectively, under the control of bit stream logic 1108.

When bit 14 of the current ROM word is zero, indicating incomplete execution of the current command, to provide the next ROM address, six bits (9:4) of the current ROM word are combined with either (i) the next four bits at the head of the code stream, when bit 11 of the current ROM word is set, or (ii) another four bits (3:0) of the current ROM word, when bit 10 of the current ROM word is set. The value of bit 11 of the current ROM word indicates that the next ROM access is for decoding purpose, and thus requiring that the remaining four bits of the next ROM address to be taken from the head of the code stream. Alternatively, if the next ROM access is for control purpose, as indicated by the value of bit 10 of the current ROM word, the remaining four bits of the next ROM address is taken from bits 3:0 of the current ROM word.

If the current command is a block command, and bit 14 of the current ROM word is set, indicating that the run length portion of an encoded AC value-runlength pair is identified, the next ROM address is formed by a predetermined 4-bit pattern (in this embodiment, 4'b1101), and the identified 6-bit run length. The identified runlength is found in (i) zdata counter 1111, if the end of block (EOB) symbol is identified; (ii) the value obtained by cascading the contents of registers 1102b and 1102c, if the short escape symbol is identified; (iii) the value obtained by cascading the contents of registers 1102a and 1102b, if the long escape symbol is identified; or (iv) bits 10:6 of the current ROM word, otherwise. During processing of either a short or long escape symbol, VLC decoder 211 verifies that the 16-bit level code (i.e. the AC value) is within one of the permissible ranges of value. There are three illegal ranges: (i) the value represented by bit pattern $1000_{13}$ $0000_{13}$ $0000_{13}$ 0000, (ii) the range represented by values between $1000_{13}$ $0000_{13}$ $1000_{13}$ 0001 and $1000_{13}$ $0000_{13}$ $1111_{13}$ 1111; and (iii) the range represented by values between $0000_{13}$ 0000 0000 0000 and $0000_{13}$ $0000_{13}$ $0111_{13}$ 1111. The verification that a level code is within a legal range is accomplished by mapping the 4 bits shifted from the code stream every clock period to the low addresses of the ROM, using specific bits of the ROM address last accessed, in the same manner as discussed above with respect to a decoding operation. If the 16-bit level code is within an illegal range, the contents of the address in the ROM reached will signal the illegal 16-bit level code.

In the present embodiment, the output register of decoder FIFO 210, 16-bit register 1112, 5-bit register 1113, 4-bit register 1102d, 4-bit register 1102c, 4-bit register 1102b and 3-bit register 1102a form a 7-stage
pipelined data path. In addition, the output data of registers 1102a–1102b can also be treated as a 15-bit register.

At the beginning of each clock period, the left shifter 1109 provides to register 1113 the 5 bits at the head of the code stream. Four of these five bits may be used to access the next ROM word, which provides the number of bits (up to 4 bits) to advance the head of the code stream in the next clock period. In this embodiment, the head of the code stream is monitored by a bit pointer in bit stream logic unit 1108. One clock period after the bit pointer advances (towards the least significant bit) past the code bit at bit 0 of register 1112, the content of the output register of decoder FIFO 210 is loaded into register 1112, and the next entry in decoder FIFO 210 is loaded into the output register of decoder FIFO 210. Because the most significant 9 bits of the output register of decoder FIFO 210 is available to left shifter 1109, 5 bits at the head of the code stream (which is now in the output register of decoder FIFO 210) can be provided by left shifter 1109, without stalling, to form the next ROM address. Although only four bits are used to form the next ROM address, the fifth bit at the head of the code stream is used immediately in a block command after resolving an AC coefficient to determine the sign of the amplitude value to follow.

In addition to providing right shifting to the 5-bit output of left shifter 1109, right shifter 1110 also sign extends the shifted values of the DC and AC components of the luma and chroma block commands.

As discussed above, control of VLC decoder 211 is accomplished by ROM 1105. For example, after decoding the run length of an AC coefficient-run length pair, each ROM word accessed until the end of execution of the current block command will direct decrementing the zdata counter 1111 and enables a zero value to be output on zdata bus 205.

The right and left shifters 1110 and 1109 provide shifting of bits in the "get bits" commands. Since at most 4 bits are shifted per clock period, multiple clock periods are necessary to get more than 4 bits. In the first clock, for a "get n bits" command, (n modulo 4) bits are right shifted and the remaining number of bits are successively shifted 4 bits at a time into the pipeline formed by registers 1102a–1102d.

When the output value of VLC decoder 211 is taken from the current ROM word, bits 14–10 of global bus 209 is set to zero, and bits 9–0 of the current ROM word is output as bits 9–0 on global bus 209 through multiplexers 1114a and 1114b. If the output value of VLC decoder 211 is taken from the code stream, the multiplexers 1114a and 1114b select the output data of register 1102d and right shifter 1110 respectively. Multiplexers 1114a and 1114b can each be selected to provide inverted output values. Such inverted output values are desirable for providing, during execution of a block command, when necessary, 1's complement for a DC amplitude value, or a 2's complement value for an AC amplitude value. Zdata incrementer 1113 completes the 1's complement or 2's complement computation.

Pixel Filter and Motion Compensation

Pixel filter 214 receives reference frames from memory controller 206 and retrieves from pixel memory 213 the decompressed video data from CPU 201. In accordance with the MPEG standard, the reference frames are combined with the decompressed video data using one or more motion vectors, which relates ("predicts") the video data to the reference frames. The resulting video image is written back to DRAM 217 for later output via video FIFO 217 and video bus 205. Under the MPEG standard, the decompressed video data may represent no prediction (i.e. independent of a reference frame), backward prediction (i.e. dependent upon a reference frame of a later time), forward prediction (i.e. dependent upon a reference frame of an earlier time), or interpolated prediction (i.e. dependent upon both a reference frame of an earlier time and a reference frame of a later time).

In the present embodiment, if the video data are not of the "no prediction" type, blocks of one or more reference frames are fetched from DRAM 217. These blocks are each 9×9 components. Since each page of DRAM 217 stores 8 rows and 32 columns of pixels (256 pair of pixels per page), a fetch of a 9×9 block of components crosses at least one page boundary. (In fact, because two pixels are stored in one word of DRAM 217, the actual fetch involves a 10×9 block of pixels). To minimize page crossings, the present embodiment uses the method of access in which all the pixels of the 9×9 block residing in one memory page are accessed before the remaining pixels of the block residing in another memory page are accessed. This method was discussed with respect to motion compensation in an embodiment disclosed in the copending parent application, Ser. No. 07/669,818, incorporated by reference above.

Figure 9:
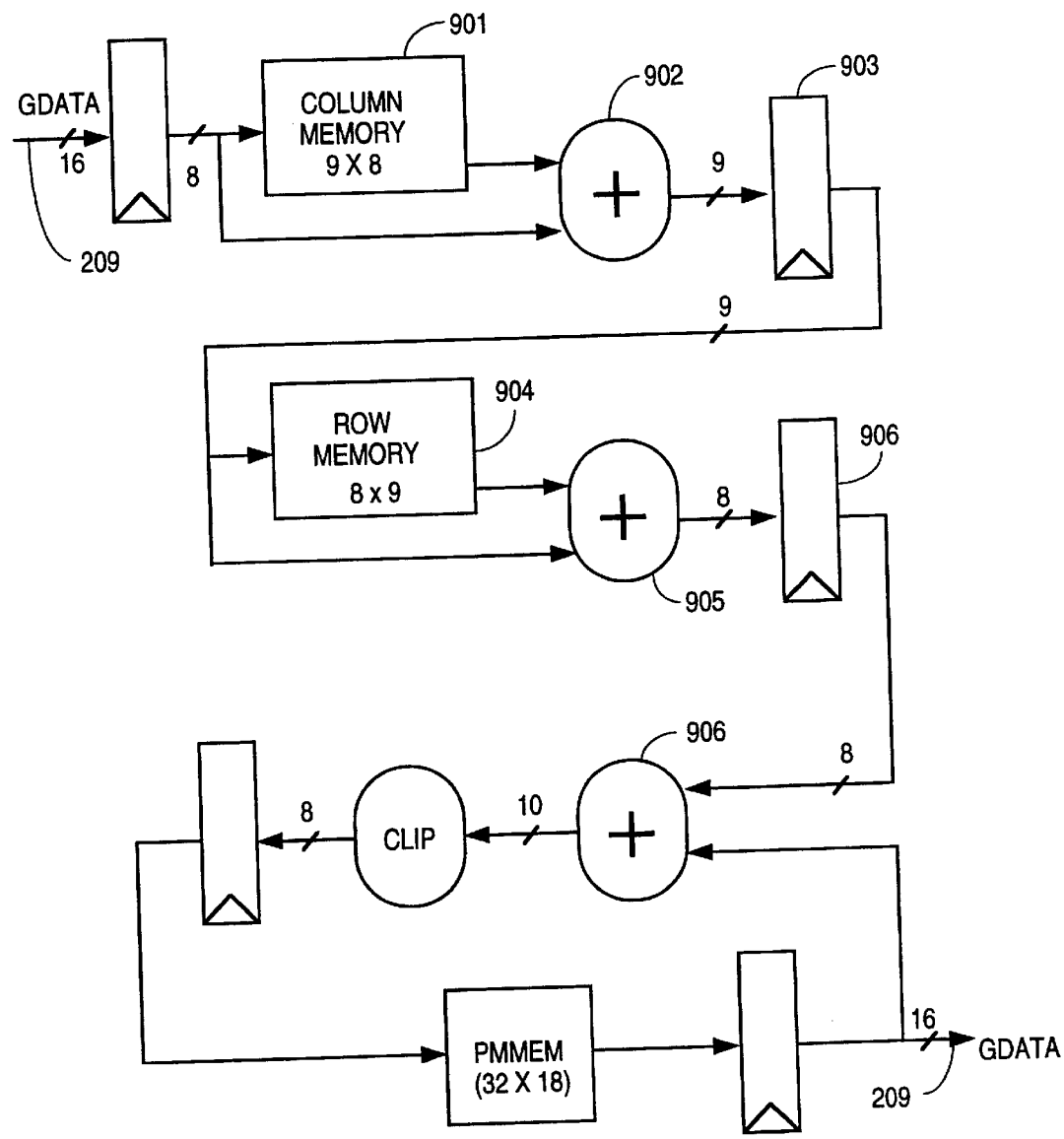
FIG. 9 is a block diagram of a pixel filter and motion compensation module comprising pixel filter 213 and pixel memory 214.

FIG. 9 is a block diagram of pixel filter 213. Pixel pairs are fetched from DRAM 217 and provided to pixel filter 213 on global bus 209. The motion vector consists of x and y components, which are respectively stored in x and y registers (not shown). The x component of the motion vector indicates whether the first column in the 10×9 block of pixels fetched is part of the 9×9 pixel reference block. The y component of the motion vector indicates how many rows of the 10×9 block fetched are in the first memory page.

Every other cycle a pixel pair arrives at global bus 209, and every cycle pixel filter 213 processes one pixel. Column memory 901, which is a 9×8 bit random access memory, stores the last column of pixels previously accessed. As the pixels of the present column arrives, each arriving pixel is averaged (i.e. filtered in the x direction) by adder 902 with the pixel of the same row stored in column memory 901. The arriving pixel then replaces the corresponding pixel stored in column memory 901. The result of adder 902 is latched into pipeline register 903.

The filtered pixels are then averaged (i.e. filtered in the y direction) by adder 905 with the filtered pixels of the previous row stored in row memory 904. Each incoming pixel from pipeline register 903 replaces the corresponding pixel in row memory 904. The resulting filtered pixel from adder 905 are latched successively into pipeline register 906. The net result of the averaging in the x and y direction is a translation ("resampling") of the 8×8 block by one-half pixel, as required by the MPEG standard. The resampled reference frame is then added by adder 906 to the decompressed video data in pixel memory 213. Pixel memory 213 comprises two halves, each half alternately receives in a double buffer scheme decompressed data from CPU 201 and provides pixels to the pixel filtering in pixel filter 213.

In the present embodiment, x and y registers are provided for both forward and backward motion vectors. In processing interpolated predicted blocks, the forward reference frame (associated with the forward motion vector) is fetched first for forward compensation. The result of the forward compensation is stored in pixel memory 213 for backward compensation using the backward reference frame, which is fetched after the forward compensation.

Video Interface

Figure 10:
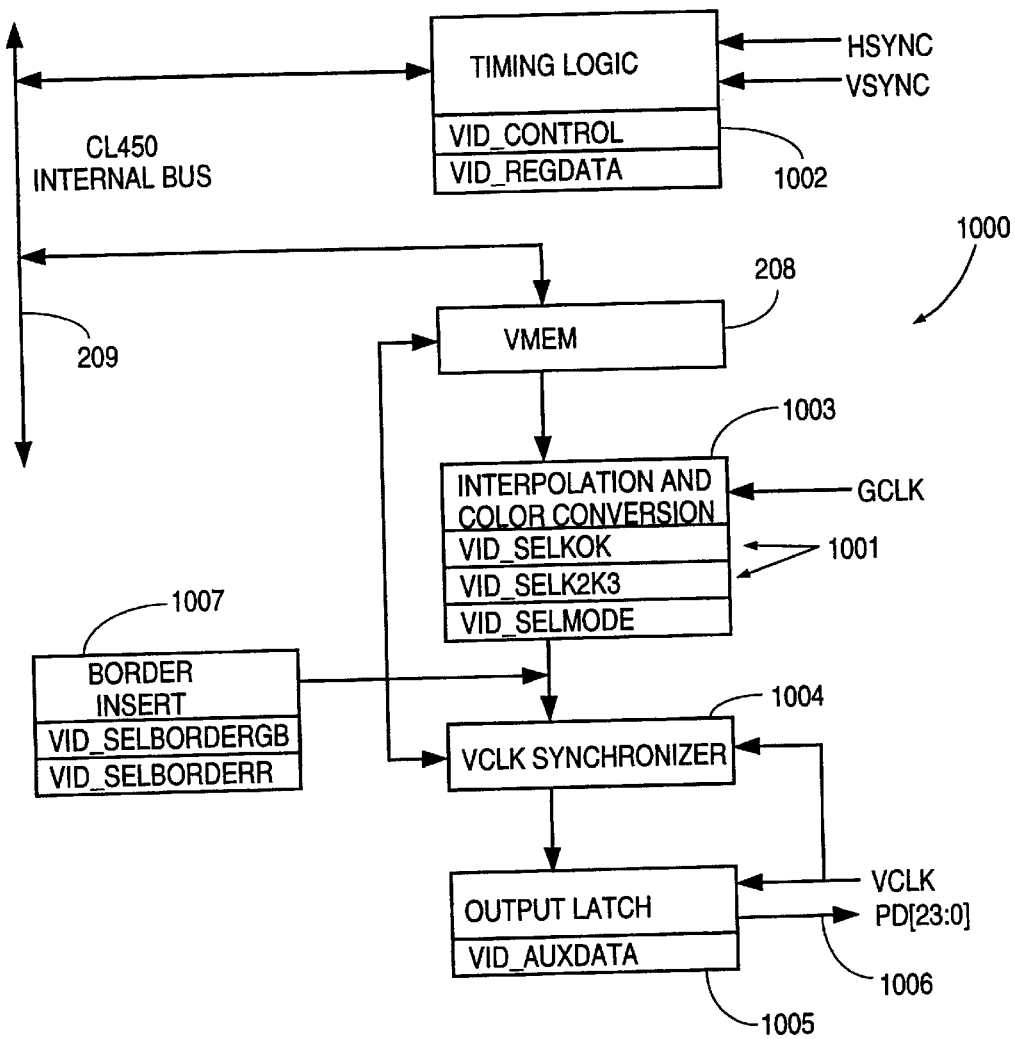
FIG. 10 is a block diagram of a video interface comprising video FIFO 208 and YUV/RGB conversion circuits.

The filtered and motion compensated video data are provided as output, on video bus 205, of video decoder 200 to the video interface. A block diagram of the video interface is shown in FIG. 10. As shown in FIG. 10, video data are provided as pixel pairs to video interface (generally indicated in FIG. 10 by reference numeral 1000) via global bus 209. CPU 201 also provides control information to video interface 1000 over global bus 209.

Such control information includes, for example, conversion factors necessary to convert between YUV represented data (i.e. luminance-chrominance representation) and RGB represented data, and the starting and ending positions of active data in a scan line. The conversion factors are stored in registers 1001. Timing logic 1002 which receives synchronization signals VSYNC and HSYNC (vertical and horizontal synchronization signals) synchronizes the operation of the video interface 1000 with the video data stream received.

The pixels in each pair of incoming pixels are YUV represented and are the same Y, U or V type. These pixels are stored in video FIFO 208, which comprises in fact two fifos, respectively referred as video FIFO 208a and video FIFO 208b. Video FIFO 208a and video FIFO 208b store luminance (Y) and chrominance (U or V) data respectively.

In this embodiment, the YUV represented data can be converted for output, at the user's option, as RGB represented data. Conversion from YUV represented data into RGB represented data is accomplished in block 1003. A synchronizer circuit 1004 receiving externally provided video clock signal VCLK provides the output video data on 24-bit bus 1006 at the desired rate.

The above detailed description is provided to illustrate specific embodiments of the present invention, and is not intended to be limiting. Numerous modifications and variations within the scope of the present invention are possible. The present invention is defined by the following claims.

We claim:

1. An apparatus for decoding compressed video data, said compressed video data being discrete cosine transform (DCT) coefficients of pixels compressed into variable length codes, said apparatus comprising:

a global bus;

a central processing unit, said central processing unit controlling a plurality of coprocessing units, said central processing unit and each of said coprocessing units communicating with each other over said global bus, said plurality of coprocessing units comprising:

(a) a memory controller for controlling storing and retrieving data from a memory system;

(b) a host interface unit for receiving from a host computer said variable length codes and for causing said variable length codes to be stored in said memory system;

(c) a decoder causing said variable length codes to be retrieved from said memory system for decompressing said variable length codes to recover said DCT coefficients;

(d) inverse discrete cosine transform unit receiving said DCT coefficients for transforming said DCT coefficients to recover said pixels; and (e) pixel output unit for providing said pixels to an image rendering device;

wherein said central processing unit comprises:

a multiplier-subtractor circuit receiving first second and third input data for providing a fourth datum which equals the product of said first and second input data less said third input datum; and a "butterfly" circuit receiving said fourth datum and a fifth datum for providing first and second output data which equal respectively the sum and differences of said fourth and fifth data.

2. The apparatus of claim 1, further comprising:

a plurality of registers;

means for providing selected constant values; and means for retrieving from said registers and said providing means said first, second, third and fifth data, for storing said first and second output data in registers, and, in accordance with an algorithm, for alternatively storing said fourth datum in said registers and bypassing said registers.

3. The apparatus of claim 1, further comprising:

a decrementer for receiving a sixth input datum and providing as output a seventh datum, said seven datum being one of (i) said sixth datum and (ii) said sixth datum decremented by a predetermined value; and a clamp circuit receiving said seventh datum for and providing as an output datum said first datum, said first datum being said seventh datum restricted to a predetermined range.

4. The apparatus of claim 1, further comprising:

a multiplexer for alternately selecting said first and second output data of said "butterfly circuit"; and means for coupling said output datum selected by said multiplexer to one of (i) a temporary memory for storing intermediate data of said discrete cosine transform, and (ii) a memory for storing results of said discrete cosine transform.

5. The apparatus of claim 4, further comprising a clamp circuit for restricting said output datum selected to a predetermined range prior to coupling said output datum selected to said memory for storing results.

6. The apparatus of claim 1, further comprising means for retrieving from said memory a sixth and a seventh datum, and wherein accordance with a predetermined algorithm, said butterfly circuit accepts as input data said sixth and seventh data in lieu of said fourth and fifth data.

7. The apparatus of claim 1, wherein said multiplier-subtractor comprises a pipelined structure receiving a clock signal, such that, even though said multiplier-subtractor completes an operation over multiple periods of said clock signals, said multiplier-subtractor receives input data every period of said clock signal and provides output data every period of said clock signal.

8. The apparatus of claim 1, wherein each of said discrete cosine transform and said inverse discrete cosine transform is performed in two passes over a square matrix of input data, wherein said input data are provided to said structure in row order in one pass, and provided in column order in the other pass.

9. An apparatus as in claim 1, wherein said inverse discrete cosine transform unit is part of said central processing unit.

10. An apparatus as in claim 1, wherein said central processing unit comprises a microcoded processor.

11. An apparatus as in claim 1, wherein said variable length codes further comprises encoded motion vectors decoded by said decoder, and wherein said memory system storing reference frames of pixels, said pixel output unit further comprises:
   a motion compensation unit for combining said pixels recovered by said inverse cosine transform unit with said reference frames of pixels in accordance with said motion vectors to reconstitute pixels of an image; and
   video output bus for providing said pixels of an image in accordance with a predetermined image representation convention to said image rendering device.

12. A method for decoding compressed video data, said compressed video data being discrete cosine transform (DCT) coefficients of pixels compressed into variable length codes, said method comprising the steps of:
   providing a global bus;
   providing a central processing unit, said central processing unit controlling a plurality of coprocessing units, said central processing unit and each of said coprocessing units communicating with each other over said global bus, said plurality of coprocessing units being provided by steps comprising:
      (a) providing a memory controller for controlling storing and retrieving data from a memory system;
      (b) providing a host interface unit for receiving from a host computer said variable length codes and for causing said variable length codes to be stored in said memory system;
      (c) providing a decoder causing said variable length codes to be retrieved from said memory system for decompressing said variable length codes to recover said DCT coefficients;
      (d) providing inverse discrete cosine transform unit receiving said DCT coefficients for transforming said DCT coefficients to recover said pixels; and
      (e) providing pixel output unit for providing said pixels to an image rendering device;
   said step of providing a central processing unit further comprising the steps of:
      providing a multiplier-subtractor circuit receiving first second and third input data for providing a fourth datum which equals the product of said first and second input data less the said third input datum; and
      providing a "butterfly" circuit receiving said fourth datum and a fifth datum for providing first and second output data which equal respectively the sum and differences of said fourth and fifth data.

13. A method as in claim 12, further comprising the steps of:
   providing a plurality of registers;
   providing selected constant values; and
   retrieving from said registers and said constant values said first, second, third and fifth data, for storing said first and second output data in registers, and, in accordance with an algorithm, for alternatively storing said fourth datum in said registers and bypassing said registers.

14. A method as in claim 12, further comprising the steps of:
   providing a decrementer for receiving a sixth input datum and providing as output a seventh datum, said seven datum being one of (i) said sixth datum and (ii) said sixth datum decremented by a predetermined value; and
   providing a clamp circuit receiving said seventh datum for and providing as an output datum said first datum, said first datum being said seventh datum restricted to a predetermined range.

15. A method as in claim 12, further comprising the steps of:
   providing a multiplexer for alternately selecting said first and second output data of said "butterfly circuit"; and
   coupling said output datum selected by said multiplexer to one of (i) a temporary memory for storing intermediate data of said discrete cosine transform, and (ii) a memory for storing results of said discrete cosine transform.

16. A method as in claim 15, further comprising the step of restricting said output datum selected to a predetermined range prior to coupling said output datum selected to said memory for storing results.

17. A method as in claim 12, further comprising the step of retrieving from said memory a sixth and a seventh datum, and wherein accordance with a predetermined algorithm, said butterfly circuit accepts as input data said sixth and seventh data in lieu of said fourth and fifth data.

18. A method as in claim 12, wherein said step of providing a multiplier-subtractor comprises the step of providing a pipelined structure receiving a clock signal, such that, even though said multiplier-subtractor completes an operation over multiple periods of said clock signals, said multiplier-subtractor receives input data every period of said clock signal and provides output data every period of said clock signal.

19. A method as in claim 12, wherein each of said discrete cosine transform and said inverse discrete cosine transform is performed in two passes over a square matrix of input data, wherein said input data are provided in row order in one pass, and provided in column order in the other pass.

20. A method as in claim 12, wherein said step of providing said inverse discrete cosine transform unit provides said inverse discrete cosine transform unit as part of said central processing unit.

21. A method as in claim 12, wherein said step of providing central processing unit comprises the step of providing a microcoded processor.

22. A method as in claim 12, wherein said variable length codes further comprises encoded motion vectors decoded by said decoder, and wherein said memory system storing reference frames of pixels, said step of providing said pixel output unit further comprises the steps of:

providing a motion compensation unit for combining said pixels recovered by said inverse cosine transform unit with said reference frames of pixels in accordance with said motion vectors to reconstitute pixels of an image; and providing video output bus for providing said pixels of an image in accordance with a predetermined image representation convention to said image rendering device.

* * * * *